United States Patent
Danno

(10) Patent No.: US 10,087,549 B2
(45) Date of Patent: Oct. 2, 2018

(54) METHOD FOR PRODUCING SIC SINGLE CRYSTAL HAVING LOW DEFECTS BY SOLUTION PROCESS

(71) Applicant: TOYOTA JIDOSHA KABUSHIKI KAISHA, Toyota-shi, Aichi (JP)

(72) Inventor: Katsunori Danno, Susono (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 97 days.

(21) Appl. No.: 15/021,762

(22) PCT Filed: Sep. 1, 2014

(86) PCT No.: PCT/JP2014/072927
§ 371 (c)(1),
(2) Date: Mar. 14, 2016

(87) PCT Pub. No.: WO2015/037465
PCT Pub. Date: Mar. 19, 2015

(65) Prior Publication Data
US 2016/0230309 A1   Aug. 11, 2016

(30) Foreign Application Priority Data
Sep. 13, 2013 (JP) ................................. 2013-191191

(51) Int. Cl.
*C30B 19/12* (2006.01)
*C30B 29/36* (2006.01)
*C30B 19/04* (2006.01)

(52) U.S. Cl.
CPC .............. *C30B 19/12* (2013.01); *C30B 19/04* (2013.01); *C30B 29/36* (2013.01)

(58) Field of Classification Search
CPC .... C30B 9/00; C30B 9/04; C30B 9/08; C30B 9/10; C30B 9/12; C30B 11/00;
(Continued)

(56) References Cited

U.S. PATENT DOCUMENTS

| 5,958,132 A | 9/1999 | Takahashi et al. |
| 2003/0070611 A1* | 4/2003 | Nakamura .............. C30B 23/00 117/109 |

(Continued)

FOREIGN PATENT DOCUMENTS

| CN | 101796227 A | 8/2010 |
| DE | 10247017 A1 | 8/2003 |

(Continued)

OTHER PUBLICATIONS

Sep. 29, 2017 Office Action issued in U.S. Appl. No. 14/394,790.
Apr. 10, 2018 Office Action issued in U.S. Appl. No. 14/394,790.

*Primary Examiner* — Kenneth A Bratland, Jr.
(74) *Attorney, Agent, or Firm* — Oliff PLC

(57) ABSTRACT

A SiC single crystal having low density of threading screw dislocations, threading edge dislocations, micropipe defects, base plane dislocations and stacking faults is provided. This is achieved by a method for producing a SiC single crystal in which a SiC seed crystal substrate is contacted with a Si—C solution having a temperature gradient such that the temperature decreases from the interior toward the surface, to grow a SiC single crystal, the method including: a first step in which a SiC single crystal is grown with a (1-100) plane as the growth surface, a second step in which a {0001} plane is exposed from the grown SiC single crystal, and a third step in which the SiC single crystal having the exposed {0001} plane is used as a seed crystal, and the {0001} plane is used as the growth surface for growth of a SiC single crystal.

6 Claims, 10 Drawing Sheets

(58) Field of Classification Search
CPC ......... C30B 11/14; C30B 15/00; C30B 15/20;
C30B 15/36; C30B 19/00; C30B 19/02;
C30B 19/04; C30B 19/12; C30B 29/00;
C30B 29/10; C30B 29/36
USPC ... 117/11, 13, 19, 35–36, 54, 58, 63–65, 67,
117/73, 902, 937, 951
See application file for complete search history.

(56) References Cited

U.S. PATENT DOCUMENTS

| | | |
|---|---|---|
| 2004/0050320 A1 | 3/2004 | Maruyama et al. |
| 2007/0034145 A1 | 2/2007 | Maruyama et al. |
| 2009/0084309 A1 | 4/2009 | Sakamoto |
| 2009/0184327 A1* | 7/2009 | Oyanagi ................ C30B 19/04 257/77 |
| 2009/0194017 A1 | 8/2009 | Terashima et al. |
| 2010/0236472 A1* | 9/2010 | Terashima ............... C30B 9/10 117/73 |
| 2011/0200833 A1 | 8/2011 | Kamei et al. |
| 2012/0118221 A1* | 5/2012 | Danno ................... C30B 15/14 117/54 |
| 2013/0220212 A1 | 8/2013 | Kusunoki et al. |
| 2014/0127466 A1 | 5/2014 | Danno |
| 2014/0291700 A1 | 10/2014 | Gunjishima et al. |
| 2015/0128847 A1* | 5/2015 | Danno ................... C30B 29/36 117/67 |

FOREIGN PATENT DOCUMENTS

| | | |
|---|---|---|
| JP | H05-262599 A | 10/1993 |
| JP | H06-227886 A | 8/1994 |
| JP | H10-509943 A | 9/1998 |
| JP | 2001-294499 A | 10/2001 |
| JP | 2002-255693 A | 9/2002 |
| JP | 2003-119097 A | 4/2003 |
| JP | 2003-277193 A | 10/2003 |
| JP | 2004-352590 A | 12/2004 |
| JP | 2007-197231 A | 8/2007 |
| JP | 2008-105896 A | 5/2008 |
| JP | 2009-188117 A | 8/2009 |
| JP | 2012-101960 A | 5/2012 |
| JP | 2014-201466 A | 10/2014 |
| WO | 96/17112 A1 | 6/1996 |
| WO | 2013/005347 A1 | 1/2013 |
| WO | 2013/081164 A1 | 6/2013 |
| WO | 2013/157418 A1 | 10/2013 |

* cited by examiner 1 mm 1 mm

METHOD FOR PRODUCING SIC SINGLE CRYSTAL HAVING LOW DEFECTS BY SOLUTION PROCESS

TECHNICAL FIELD

The present invention relates to a SiC single crystal that is suitable for a semiconductor element, and to a method for producing it, and more specifically it relates to a high-quality SiC single crystal with low defects and to a method for producing a high-quality SiC single crystal by a solution process.

BACKGROUND ART

SiC single crystals are thermally and chemically very stable, superior in mechanical strengths, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Typical growth processes for growing SiC single crystals that are known in the prior art include gas phase processes, the Acheson process and solution processes. Among gas phase processes, for example, sublimation processes have a drawback in that grown single crystals have been prone to hollow penetrating defects known as "micropipe defects", lattice defects, such as stacking faults, and generation of polymorphic crystals However, most SiC bulk single crystals are conventionally produced by sublimation processes because of the high crystal growth rate. It has also been attempted to reduce defects in grown crystals, and there has been proposed a method of reducing defects by repeated crystal growth on the (11-20) plane and (1-100) plane by using a sublimation process (PTL 1). In the Acheson process, heating is carried out in an electric furnace using silica stone and coke as starting materials, and therefore it has not been possible to obtain single crystals with high crystallinity due to impurities in the starting materials.

A solution process is a process in which molten Si or an alloy melted in molten Si is situated in a graphite crucible and C is dissolved into the molten liquid, and then a SiC crystal layer is deposited and grown on a seed crystal substrate set in the low temperature zone. Solution processes can be expected to reduce defects because crystal growth is carried out in a state of near thermal equilibrium, compared to gas phase processes. In recent years, therefore, several methods for producing SiC single crystals by solution processes have been proposed, such as methods in which SiC single crystals with highly flat growth surfaces are obtained (PTL 2), while methods for obtaining SiC single crystals with few crystal defects have also been proposed (PTL 3).

CITATION LIST

Patent Literature

[PTL 1] Japanese Unexamined Patent Publication No. 2003-119097

[PTL 2] Japanese Unexamined Patent Publication No. 2007-197231

[PTL 3] Japanese Unexamined Patent Publication HEI No. 6-227886

SUMMARY OF THE INVENTION

Problems to be Solved by the Invention

As described in PTLs 1 to 3, in sublimation processes or solution processes it has been attempted to improve the flatness of the growth surface and to reduce defects in the grown crystal. However, the aforementioned methods are still inadequate for stably obtaining high-quality SiC single crystals that can be used as semiconductor elements, and it remains difficult to efficiently produce SiC single crystals particularly with reduced threading screw dislocations, threading edge dislocations, micropipe defects, base plane dislocations and stacking faults. With sublimation processes it is difficult to obtain a single crystal containing virtually no or absolutely no threading dislocations, while in solution processes as well, dislocations of the seed crystal tend to propagate in the grown crystal, making it difficult to obtain a high-quality SiC single crystal with low density for all defects including threading screw dislocations, threading edge dislocations, micropipe defects, base plane dislocations and stacking faults.

It is an object of the present invention to solve these problems, and to provide a SiC single crystal having low density of threading screw dislocations, threading edge dislocations, micropipe defects, base plane dislocations and stacking faults, as well as a method for producing the SiC single crystal.

Means for Solving the Problems

The invention is a method for producing a SiC single crystal in which a SiC seed crystal substrate is contacted with a Si—C solution having a temperature gradient such that the temperature decreases from the interior toward the surface, to grow a SiC single crystal, the method comprising:

a first step in which a SiC single crystal is grown with a (1-100) plane as the growth surface, a second step in which a {0001} plane is exposed from the grown SiC single crystal, and a third step in which the SiC single crystal having the exposed {0001} plane is used as a seed crystal, and the {0001} plane is used as the growth surface for growth of a SiC single crystal.

The present invention is also a SiC single crystal having density of no greater than $10/cm^2$ each for threading screw dislocations, threading edge dislocations, micropipe defects and base plane dislocations, and stacking fault density of no greater than 10/cm.

Effect of the Invention

According to the invention it is possible to obtain a SiC single crystal with low density for threading screw dislocations, threading edge dislocations, micropipe defects, base plane dislocations and stacking faults.

DESCRIPTION OF EMBODIMENTS

Figure 1:
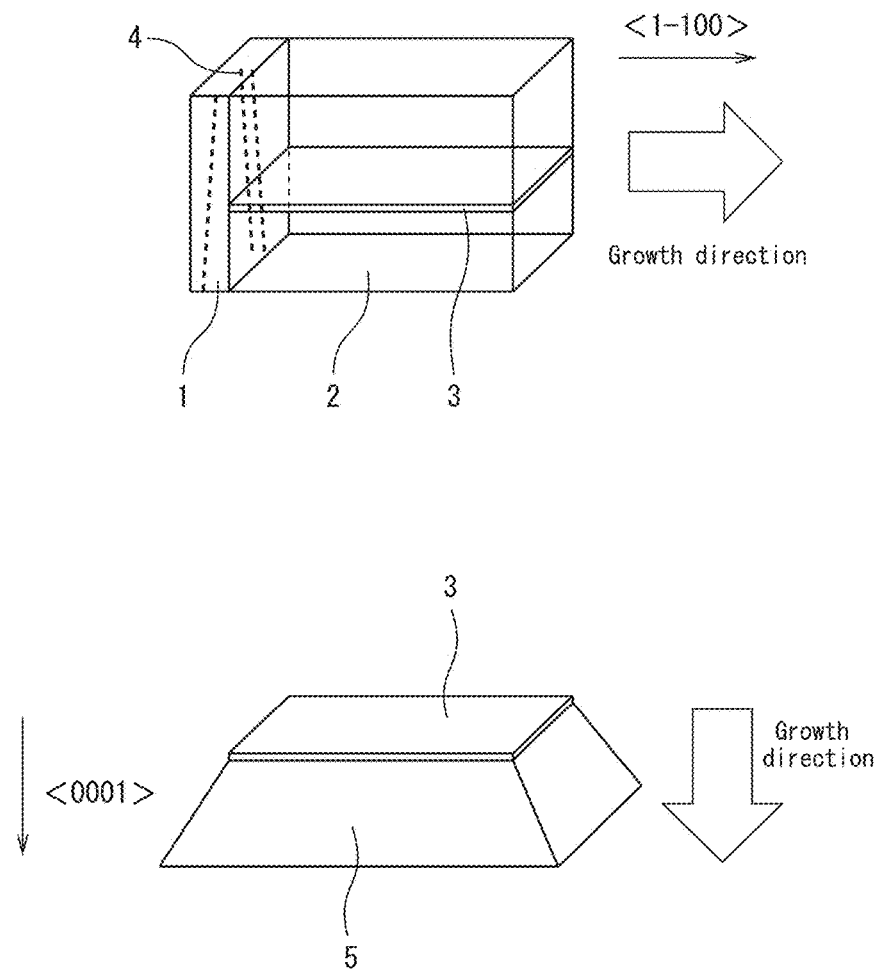
FIG. 1 is a schematic diagram illustrating the method of the invention.

Throughout the present specification, the indication "-1" in an expression, such as "(1-100) plane", is used where normally a transverse line is placed over the numeral.

As described in PTL 1 cited above, RAF growth methods have conventionally been considered effective for low defects in crystals, and repeating growth on the (11-20) plane (also known as the a-face) and growth on the (1-100) plane (also known as the m-face) by a sublimation process is carried out to produce crystals with reduced defects. However, it is difficult to obtain single crystals without defects even by RAF methods, while they also require repeated growth on the (11-20) plane and (1-100) plane, and therefore a convenient production method allowing further reduction in defect density is desired.

The present inventor has conducted diligent research on high-quality SiC single crystals, in production of SiC single crystals by solution processes, whereby threading screw dislocations, threading edge dislocations, micropipe defects, base plane dislocations and stacking faults, that are generated in grown crystals, can be reduced compared to the prior art.

As a result, there was discovered a method for producing a SiC single crystal wherein m-face growth from the (1-100) plane (also referred to as the m-face) of the seed crystal substrate is carried out by using a solution process, the {0001} plane is cut out from the SiC single crystal on which m-face growth has taken place, the SiC single crystal from which the {0001} plane has been cut out is used as the seed crystal substrate, and c-face growth from the {0001} plane (also referred to as the c-face) is carried out by using a solution process.

By conducting m-face growth using a solution process, it is possible to obtain a SiC single crystal containing virtually no or absolutely no threading screw dislocations, threading edge dislocations or micropipe defects, compared to the seed crystal. Furthermore, it was found that using this method can yield a SiC single crystal with drastically reduced threading screw dislocations, threading edge dislocations and micropipe defects compared to the seed crystal, by one-time m-face growth, without requiring repeated growth of the single crystal while changing the growth surface.

Moreover, it was found that it is possible to obtain a SiC single crystal having low density of not only threading screw dislocations, threading edge dislocations and micropipe defects (hereunder collectively referred to as "threading dislocations"), but also base plane dislocations and stacking faults, by exposing the {0001} plane from a SiC single crystal that has been m-face grown, and using the {0001} plane-exposed SiC single crystal as the seed crystal to carrying out c-face growth from the {0001} plane (also referred to as the c-face) using a solution process.

The invention relates to a method for producing a SiC single crystal in which a SiC seed crystal substrate is contacted with a Si—C solution having a temperature gradient such that the temperature decreases from the interior toward the surface, to grow a SiC single crystal, the method comprising a first step in which a SiC single crystal is grown with a (1-100) plane as the growth surface, a second step in which a {0001} plane is exposed from the grown SiC single crystal, and a third step in which the SiC single crystal having the exposed {0001} plane is used as a seed crystal, and the {0001} plane is used as the growth surface for growth of a SiC single crystal.

In the first step, the (1-100) plane of the SiC seed crystal substrate is contacted with a Si—C solution to grow a SiC single crystal on the (1-100) plane of the seed crystal substrate. In the second step, the {0001} plane is exposed from the grown SiC single crystal. Next, in the third step, the SiC single crystal having the {0001} plane exposed is used as the seed crystal to carry out crystal growth from the {0001} plane.

The method for exposing the {0001} plane from the grown SiC single crystal in the second step may be any desired method, and for example, cutting out and/or polishing may be used. The exposed {0001} plane is mirror finished by polishing, and {0001} plane growth is carried out in the third step.

According to the present method it is possible to obtain a SiC single crystal wherein the respective densities of threading screw dislocations, threading edge dislocations, micropipe defects and base plane dislocations are each no greater than 10/cm², preferably no greater than 5/cm², more preferably no greater than 1/cm² and even more preferably 0/cm², and the density of stacking faults is no greater than 10/cm, preferably no greater than 5/cm, more preferably no greater than 1/cm and even more preferably 0/cm.

A solution process is used in the method for producing a SiC single crystal according to the invention. A solution process for production of a SiC single crystal is a method in which the surface region of the Si—C solution becomes supersaturated due to formation of a temperature gradient in which the temperature decreases from the interior of the Si—C solution toward the surface of the solution in a crucible, and a SiC single crystal is grown from a seed crystal substrate contacting with the Si—C solution.

In the first step of the present method, a SiC single crystal having quality commonly used for production of SiC single crystals may be used as the seed crystal substrate. For example, a SiC single crystal commonly grown by a sublimation process may be used as the seed crystal substrate. SiC single crystals commonly grown by such a sublimation process usually include numerous threading screw dislocations, threading edge dislocations, micropipe defects, base plane dislocations and stacking faults. According to the present method it is possible to obtain a SiC single crystal with lower respective densities of threading screw dislocations, threading edge dislocations, micropipe defects, base plane dislocations and stacking faults, compared to the densities in the seed crystal substrate, and preferably with densities of zero.

As shown in FIG. 1, in the present method, a SiC seed crystal 1 with a (1-100) plane is used for (1-100) plane growth of a SiC single crystal from the (1-100) plane by using a solution process, to obtain a (1-100) plane-grown crystal 2. Next, the {0001} plane is exposed from the (1-100) plane-grown crystal 2 to obtain a SiC crystal 3 for {0001} plane growth. The SiC crystal 3 for {0001} plane growth is then used as the seed crystal for further {0001} plane growth of the SiC single crystal, to obtain a {0001} plane-grown crystal 5.

A SiC seed crystal 1 for (1-100) plane growth generally includes defects, such as threading screw dislocations, threading edge dislocations, micropipe defects, base plane dislocations and stacking faults. Linear defects capable of propagating in the vertical direction of the c-axis are shown as threading dislocations 4. Although the (1-100) plane-grown crystal 2 may include base plane dislocations and stacking faults, it contains very few or no threading screw dislocations, threading edge dislocations and micropipe defects, and therefore when further crystal growth is carried out from the {0001} plane of the SiC single crystal, it is possible to obtain a very high-quality SiC single crystal including no or virtually no threading screw dislocations, threading edge dislocations and micropipe defects, as well as no or virtually no base plane dislocations and stacking faults.

This is because when {0001} plane growth is conducted, very little or absolutely no threading dislocation is present on the {0001} plane of the seed crystal which is the growth origin, and therefore very little or absolutely no threading dislocation propagates from the seed crystal with the {0001} plane to the grown crystal, and any base plane dislocations or stacking faults that may be present in the seed crystal do not easily propagate to the {0001} plane-grown crystal 5.

Table 1 shows the major defect properties in a 4H-SiC single crystal.

TABLE 1

Nature of major defects in 4H—SiC single crystal

| Type of defect | Burgers vector | Propagation direction of defect |
|---|---|---|
| Micropipe | n<0001> (n ≥ 3) | Parallel to <0001> |
| Threading screw dislocation | n<0001> (n = 1, 2) | Parallel to <0001> |
| Threading edge dislocation | a<11-20>/3 | Parallel to <0001> |
| Base plane dislocation | a<11-20>/3 | Perpendicular to <0001> |
| Stacking fault | a<11-20>/3 or <0001>/m | Perpendicular to <0001> |

The SiC seed crystal substrate with the (1-100) plane to be used in the first step may have any desired shape, such as laminar, discoid, cylindrical, square columnar, truncated conic or truncated pyramidal, for example. The (1-100) plane of the seed crystal may be used as the bottom face of the seed crystal substrate contacting with the Si—C solution surface, and the top face on the opposite side may be used as the face held on a seed crystal holding shaft, such as a graphite shaft.

In the first step of the method of the invention, the (1-100) plane of the SiC seed crystal substrate is contacted with a Si—C solution to grow a SiC single crystal on the (1-100) plane of the seed crystal substrate. During this step, the (1-100) plane of the seed crystal substrate to be used in the method of the invention includes planes with offset angles of preferably within ±10°, more preferably within ±5° and even more preferably within ±1°, and yet more preferably it is the onset axis plane.

Also, in the third step of the method of the invention, the {0001} plane of the SiC seed crystal substrate is contacted with a Si—C solution to grow a SiC single crystal on the {0001} plane of the seed crystal substrate. During this step, the {0001} plane of the seed crystal substrate to be used in the method of the invention includes planes with offset angles of preferably within ±8°, more preferably within ±4° and even more preferably within ±1°, and yet more preferably it is the onset axis plane.

When a thick crystal exceeding 500 µm is grown in the third step, the growth surface is preferably a (000-1) plane (C-face).

Repeated growth of the SiC single crystal is preferably carried out by the method of the invention to obtain a thick grown crystal. In particular, repeated m-face growth is preferred in the first step.

In order to obtain a c-face growth crystal with a large diameter in the third step of the method of the invention it is necessary for the SiC single crystal used as the seed crystal to have a c-face with a prescribed area, and for this purpose a m-face grown crystal with a prescribed thickness (lengthwise) is necessary. In order to obtain a m-face grown crystal with the prescribed thickness, it is effective to increase the growth rate, lengthen the growth time, and perform growth repeatedly several times. However, since inclusions tend to be generated in m-face growth it is difficult to increase the growth rate, and if the growth time is too long, polycrystals may be generated in the grown crystal, as explained below. For m-face growth, therefore, it is more effective to repeatedly carry out growth several times.

When a SiC single crystal is repeatedly grown by a solution process, the grown crystal is used as the seed crystal for further SiC single crystal growth. However, the grown crystal used as the seed crystal may include polycrystalline portions. When a further crystal growth is carried out from a grown crystal containing polycrystals, numerous polycrystals are generated at the end such that it is often not possible to obtain a SiC single crystal, and therefore one measure that may be taken is to polish the growth surface of the grown crystal used as the seed crystal to remove the polycrystals. However, for controlling generation of polycrystals it may be insufficient merely to polish the growth surface of the grown crystal to be used as the seed crystal.

The present inventor has found that when repeated growth is conducted, removing the polycrystalline sections and/or low crystalline single crystal sections on the side faces with respect to the growth direction of the grown crystal is effective for minimizing generation of polycrystals in subsequent crystal growth.

The first step and/or third step of the method of the invention may include:

(A) a step in which a SiC crystal is grown from a seed crystal, (B) a step in which at least part of polycrystalline sections and/or low crystalline single crystal sections is removed from the side faces with respect to the growth direction of the SiC crystal grown in step (A) or step (C), and (C) a step in which a SiC crystal is grown from the SiC crystal grown in step (A) or the SiC crystal obtained in step (B). Step (B) and step (C) may be carried out once, or two or more times.

In step (A), a SiC crystal is grown from the seed crystal which is a SiC single crystal. However, the grown SiC crystal may include not only a satisfactory crystalline single crystal but also polycrystalline sections and/or low crystalline single crystal sections.

The polycrystalline sections or low crystalline single crystal sections can be generated particularly on the side faces with respect to the growth direction of the grown crystal.

When the SiC crystal grown in step (A) contains polycrystalline sections and/or low crystalline single crystal sections, it is possible, in step (B), to remove the polycrystalline sections and/or low crystalline single crystal sections from the side faces with respect to the growth direction of the SiC crystal grown in step (A).

In step (C), further growth of a SiC crystal can be carried out from the SiC crystal from which polycrystalline sections and/or low crystalline single crystal sections have been removed in step (B).

Thus, the SiC crystal is grown from the seed crystal in step (A), and then step (B) and step (C) may be carried out at least once in that order.

Step (B) and step (C) may be carried out several times. The SiC crystal grown in step (C) may contain polycrystalline sections and/or low crystalline single crystal sections, in which case it is possible, in step (B), to again remove the polycrystalline sections and/or low crystalline single crystal sections from the side faces with respect to the growth direction of the SiC crystal. Further growth of the SiC crystal may then be conducted in step (C). Thus, for example, step (B) and step (C) may be repeated several times in that order, following step (A).

In addition, step (B) and step (C) may be each carried out a different number of times. For example, when the SiC crystal grown from the seed crystal in step (A) contains no polycrystalline sections and/or low crystalline single crystal sections, or the polycrystalline sections and/or low crystalline single crystal sections that are present are small and considered to have minimal effect on subsequent crystal growth, step (A) may be directly followed by step (C) without step (B), for consecutive growth of the SiC crystal. When the SiC crystal grown in step (C) contains polycrystalline sections and/or low crystalline single crystal sections, the polycrystalline sections and/or low crystalline single crystal sections may again be removed in step (B).

When the SiC crystal grown in step (C) has no polycrystalline sections and/or low crystalline single crystal sections generated, or only few polycrystalline sections and/or low crystalline single crystal sections, and it is judged that their effect on subsequent crystal growth is minimal, then step (C) may be repeated until polycrystalline sections and/or low crystalline single crystal sections are generated beyond the allowable range.

When polycrystalline sections and/or low crystalline single crystal sections beyond the allowable range have been generated in the grown SiC crystal in step (C), it is possible, in step (B), to remove the polycrystalline sections and/or low crystalline single crystal sections from the side faces with respect to the growth direction of the SiC grown crystal. Growth of the SiC crystal may then again be conducted subsequently in step (C).

The "allowable range" referred to above is a level that may be established as desired, so long as it is a range in which the polycrystalline sections and/or low crystalline single crystal sections can be removed to below the desired level in step (B). The low crystalline single crystal sections are single crystal sections that include numerous stacking faults that can affect subsequent crystal growth.

The process may be terminated at either step (B) or step (C), but it is preferably terminated at step (B) in order to allow c-face growth in the third step after m-face growth in the first step.

The method for removing the polycrystalline sections and/or low crystalline single crystal sections from the side faces with respect to the growth direction of the SiC crystal in step (B) may be any desired method, and for example, the polycrystalline sections and/or low crystalline single crystal sections can be removed from the SiC crystal by cutting out and/or polishing.

Figure 2:
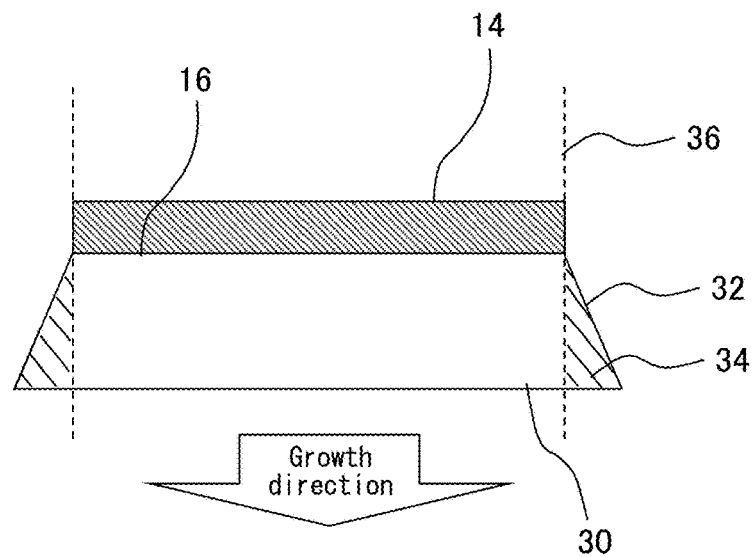
FIG. 2 is an example of a cross-sectional schematic drawing of a SiC crystal grown from a seed crystal substrate.

FIG. 2 is a cross-sectional schematic drawing of a SiC crystal grown from a seed crystal. As shown in FIG. 2, the SiC crystal 30 can be grown from the seed crystal substrate 14, and generally the SiC crystal 30 can grow so that it has a larger diameter than the bottom face 16 of the seed crystal substrate 14. When growth is such that the diameter is increased, the crystallinity of the diameter-increased section 32 is generally lower, and a polycrystalline and/or low crystalline single crystal can be generated.

When the polycrystalline and/or low crystalline single crystal-generated section 34 is the same region as the diameter-increased section 32 or a smaller region than the diameter-increased section 32, then a removal location 36 may be established for cutting out and/or polishing so that the diameter-increased section 32 is removed, as shown in FIG. 2. In other words, as shown in FIG. 2, cutting out and/or polishing may be performed in the direction perpendicular to the bottom face 16 of the seed crystal substrate 14 or parallel to the side faces of the seed crystal substrate so as to remove sections that have become enlarged outward from the same location as the edge of the bottom face 16 of the seed crystal substrate 14.

Figure 3:
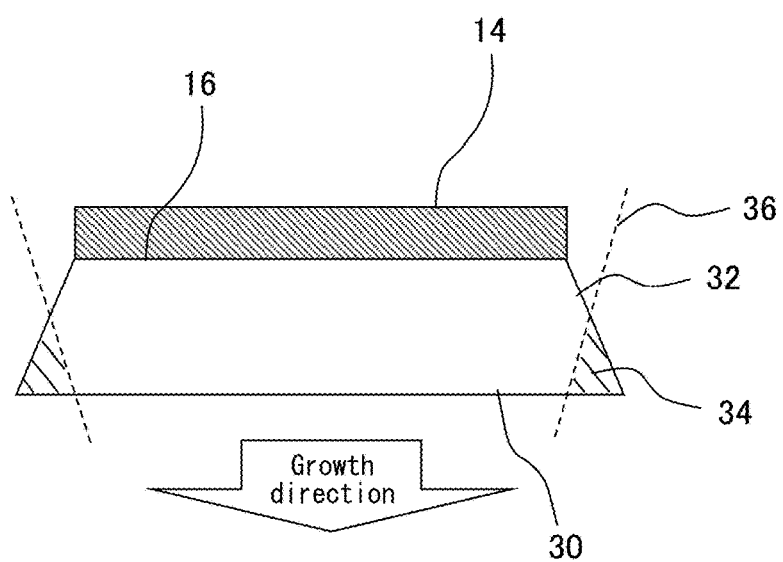
FIG. 3 is an example of a cross-sectional schematic drawing of a SiC crystal grown from a seed crystal substrate.

When the polycrystalline and/or low crystalline single crystal-generated section 34 is a smaller region than the diameter-increased section 32, as shown in FIG. 3, the removal location 36 may be established to be oblique with respect to the bottom face 16 of the seed crystal substrate 14 and cutting out and/or polishing may be performed so as to remove the polycrystalline and/or low crystalline single crystal-generated section 34.

The crystal quality of the diameter-increased section 32 is generally lower than the center section of the grown crystal, and therefore cutting out and/or polishing are preferably carried out so as to remove the diameter-increased section 32. Mirror polishing is also preferably carried out after the cutting out and/or polishing.

When polycrystalline sections and/or low crystalline single crystal sections are generated further inward than the diameter-increased section 32, or when crystal growth is conducted without a diameter-increased section 32, and a polycrystalline and/or low crystalline single crystal has been generated on the side faces of the grown crystal, the polycrystalline sections and/or low crystalline single crystal sections may be removed from the more central section region of the grown crystal (the region directly under the bottom face 16 of the seed crystal substrate).

In step (B), all of the polycrystalline sections and/or low crystalline single crystal sections on the side faces with respect to the growth direction of the grown crystal may be removed. This will allow generation of polycrystalline sections and/or low crystalline single crystal sections in the grown crystal to be minimized during subsequently conducted crystal growth.

In step (B), a portion of the outer peripheral section of the growth surface of the grown crystal may be in a roughened state. If a portion of the outer peripheral section of the growth surface of the grown crystal is in a roughened state, the Si—C solution (molten liquid) that adheres to the grown crystal when the grown crystal is raised from the Si—C solution after crystal growth will be pulled toward the roughened part of the outer peripheral section, allowing the Si—C solution (molten liquid) to collect and solidify at the outer peripheral section of the growth surface. This will prevent solidification of the Si—C solution (molten liquid) at the center section of the crystal growth plane and alleviate stress acting on the grown crystal during cooling after SiC crystal growth, and help prevent cracking of the SiC grown crystal.

The sections of the growth surface that are in a roughened state in the case of m-face growth, for example, are preferably at least portions of the outer peripheral section contacting with the side faces parallel to striped stacking faults that may be generated in the SiC grown crystal. It was found that the side faces perpendicular to striped stacking faults tend to become origins of stacking fault or polycrystal generation, and when the outer peripheral sections on the growth surface contacting with the side faces perpendicular to the stacking faults are in a roughened state, a polycrystalline and/or low crystalline single crystal will tend to be generated during crystal growth.

A "roughened" state of a section of the outer peripheral section of the growth surface is a surface state at the outer peripheral section of the growth surface such that the Si—C solution can be drawn to the outer peripheral section of the growth surface when the grown crystal is raised up from the Si—C solution after crystal growth. While it is not our intention to be constrained by theory, it is believed that the Si—C solution is drawn to the roughened part of the outer peripheral section of the growth surface because the roughened part has numerous irregularities and an increased surface area, and therefore greater adhesion.

The method for roughening part of the outer peripheral section of the growth surface may be any desired method. For example, in the aforementioned method of removing the polycrystalline sections and/or low crystalline single crystal sections, it is sufficient for removal to be such as to leave part of the polycrystalline sections and/or low crystalline single crystal sections, without entirely removing the polycrystalline sections and/or low crystalline single crystal sections from the side faces with respect to the growth direction of the grown SiC crystal. When no polycrystalline sections or low crystalline single crystal sections are present on the crystal growth plane, nicks may be intentionally created in parts of the outer peripheral section of the growth surface by using rough abrasive paper or a diamond pen.

Figure 4:
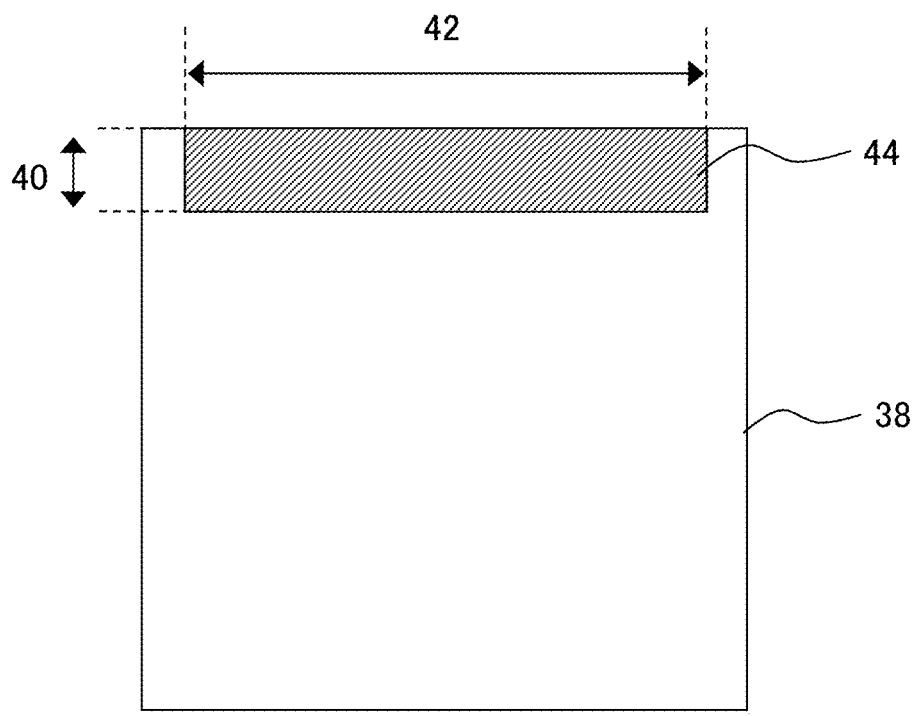
FIG. 4 is a schematic diagram of a crystal growth plane with m-surface growth, where a portion of the outer peripheral section contacting the (000-1) plane, as the side face with respect to the growth direction, is in a roughened state.

As an example, FIG. 4 shows a schematic view of a crystal growth plane 38 having a roughened section 44 on part of the outer peripheral section contacting with the (000-1) plane, as a side face with respect to growth direction when m-face growth is conducted.

As shown in FIG. 4, the width 40 of the roughened section 44 on the growth surface 38 is preferably about 0.1 to 3 mm, more preferably about 0.2 to 2 mm and even more preferably about 0.3 to 1 mm.

Also as shown in FIG. 4, the length 42 of the roughened state on the growth surface is preferably a length of about 0.1 to 10 mm, more preferably a length of about 0.5 to 6 mm and even more preferably a length of about 1 to 3 mm, parallel to the stacking fault.

The shape of the roughened section 44 does not necessarily need to be a belt shape as shown in FIG. 4 and may be any of various shapes. However, although the roughened section 44 may have any of various shapes, if the roughened section 44 generally has the width and length specified above on average it will be possible to satisfactorily collect the Si—C solution by the outer peripheral section of the growth surface. The numerical ranges specified above are the preferred ranges for crystal growth using a seed crystal substrate with a length of about 10 mm and a width of about 10 mm, and they may be appropriately adjusted to match the dimensions of the seed crystal substrate.

There are no particular restrictions on the method for removing the polycrystalline sections and/or low crystalline single crystal sections, and for example, the polycrystalline sections and/or low crystalline single crystal sections can be cut off by dicing with a diamond-coated blade.

Mirror polishing of the side faces of the grown crystal can be carried out by the same method as commonly employed mirror polishing. For example, mirror polishing can be carried out by buffing using a diamond slurry (slurry particle diameter: 1 µm).

When at least a portion of the polycrystalline sections and/or low crystalline single crystal sections on the side faces with respect to the growth direction of the grown crystal is to be removed in step (B), the growth surface of the grown crystal may be subjected to polishing and/or mirror polishing. Solidified Si—C solution will usually be adhering onto the crystal growth plane, and when the height of the solidified Si—C solution adhering to the growth surface is significant, and crystal growth is again conducted, the crystal bottom face that serves as the growth origin will have a different location contacting with the Si—C solution. In this case, the growth surface may be polished and/or mirror polished to remove the solidified Si—C solution. When numerous stacking fault stripes have been generated, the growth surface may be polished and/or mirror polished to eliminate the stacking fault stripes, since they can result in incorporation of inclusions during crystal growth. When the growth surface is subjected to polishing and/or mirror polishing, a portion of the outer peripheral section of the growth surface can be roughened either by not mirror polishing the portion of the outer peripheral section of the growth surface, or by creating nicks in the portion of the outer peripheral section after mirror polishing, using coarse abrasive paper, a diamond pen or the like.

Since the solidified Si—C solution dissolves in the Si—C solution (molten liquid) when immersed, if coverage of the solidified Si—C solution is low or the number of stacking fault stripes is low, mirror polishing of the growth surface may be omitted. Mirror polishing of the growth surface may be carried out by the same method as for mirror polishing of the side faces.

When the crystal growth plane is to be subjected to mirror polishing, a prescribed thickness may be shaved off by dicing before mirror polishing. However, there is generally little need for large shaving off of the growth surface compared to the side faces of the grown crystal, and normally polishing and mirror polishing alone are sufficient, as desired.

In the first step, preferably the (1-100) plane (m-face) is used as the crystal growth plane, and subjected to repeated growth. Even if the seed crystal contains threading dislocations, since threading dislocations do not easily propagate in the m-face grown crystal, it is possible to inhibit generation of polycrystals and low crystalline single crystals, while also inhibiting generation of threading dislocations, when repeated m-face growth is conducted, and it is possible to obtain a high-quality SiC single crystal containing no polycrystals, low crystalline single crystals or threading dislocations.

However, during lengthwise growth of the m-face, striped stacking faults may occur on the m-face growth plane of the grown crystal. When many low crystalline single crystal sections are produced having numerous stacking faults, the final result may be polycrystals generated over the entire growth surface of the grown crystal. It was found that when m-face growth is carried out, there is a tendency for each of the outer peripheral sections on the growth surface contacting with the (11-20) plane and the (−1-120) plane, among the side faces with respect to the growth direction, to act as origins of stacking fault generation.

When m-face growth is conducted, therefore, it is preferred to remove polycrystalline sections and/or low crystalline single crystal sections from at least two planes, the (11-20) plane and the (−1-120) plane. This will allow generation of polycrystalline sections and/or low crystalline single crystal sections to be inhibited during crystal growth. On the other hand, even if the other two planes, i.e., the (0001) plane and the (000-1) plane are in a roughened state without removal of polycrystalline sections and/or low crystalline single crystal sections, there is little effect on subsequent crystal growth.

When m-face growth is conducted, polycrystalline sections and/or low crystalline single crystal sections may be removed from 4 planes, i.e. from two planes which are the (11-20) plane and the (−1-120) plane, and two planes which are the (0001) plane and the (000-1) plane, as side faces with respect to the growth direction of the grown crystal.

For m-face growth, preferably the outer peripheral section of the growth surface contacting with either of the (0001) plane or (000-1) plane is in a roughened state.

By roughening the outer peripheral section of the growth surface contacting with either the (0001) plane or (000-1) plane, generation of polycrystalline and/or low crystalline single crystals is minimized, while the Si—C solution is also drawn to the roughened outer peripheral sections, to help minimize generation of cracks in the grown crystal due to adhesion of Si—C solution during cooling.

By mirror polishing the outer peripheral section of the growth surface contacting with either the (0001) plane or the (000-1) plane, and roughening the outer peripheral section of the growth surface contacting with the other plane, the Si—C solution (molten liquid) will be drawn to the roughened section and will collect at the outer peripheral section of the growth surface when the grown crystal is raised up from the Si—C solution after crystal growth, thus preventing the Si—C solution (molten liquid) from remaining at the center, alleviating the stress on the grown crystal during cooling after crystal growth, and minimizing generation of cracks in the grown crystal.

Both the (0001) plane and the (000-1) plane may also be in a roughened state. In this case as well, the Si—C solution (molten liquid) is drawn to either or both of the roughened sections at the outer peripheral sections of the growth surface contacting with the (0001) plane and (000-1) plane, when the grown crystal is raised up from the Si—C solution after crystal growth, and collects at the edge of the growth surface, thus preventing the Si—C solution (molten liquid) from remaining at the center, alleviating the stress on the grown crystal during cooling after crystal growth, and minimizing generation of cracks in the grown crystal.

When m-face growth is carried out, removal of the polycrystalline sections and/or low crystalline single crystal sections is preferably carried out every 2 to 4 mm of crystal growth, from the viewpoint of balance between production cost and grown crystal quality.

When m-face growth is repeated, the polycrystalline sections and/or low crystalline single crystal sections may be removed either each time or once every several times. For example, in the case of repeated 1 mm growth with a single m-face growth, removal of the polycrystalline sections and/or low crystalline single crystal sections is preferably carried out every 2 to 4 times, and in the case of repeated 2 mm growth, removal of the polycrystalline sections and/or low crystalline single crystal sections is preferably carried out every 1 to 2 times.

In the third step, continuous growth may be conducted with the {0001} plane (c-face) as the growth surface, or repeated growth may be conducted, as for m-face growth. When a thick crystal of 500 μm or greater is to be grown, the growth surface is preferably the (000-1) plane (C-face), in which case it is possible to accomplish bulk growth on the C-face with minimal generation of polycrystalline and/or low crystalline single crystal sections.

Because polycrystalline and/or low crystalline single crystal sections may be generated on all of the side faces with respect to the growth surface, in the case of repeated growth on the (000-1) plane (C-face), it is possible to remove all of the polycrystalline sections and/or low crystalline single crystal sections from the side faces with respect to the growth direction of the grown SiC crystal. This will allow generation of polycrystalline sections and/or low crystalline single crystal sections to be inhibited during crystal growth.

When (000-1) plane (C-face) growth is to be conducted, all of the polycrystalline sections and/or low crystalline single crystal sections may be removed from the side faces with respect to the growth direction of the grown crystal, so that the shape becomes cylindrical (so that the growth surface becomes circular).

When repeated growth is to be conducted by C-face growth, removal of the polycrystalline sections and/or low crystalline single crystal sections is preferably carried out every 3 to 6 mm of crystal growth, from the viewpoint of balance between production cost and grown crystal quality.

When repeated C-face growth is to be conducted, the polycrystalline sections may be removed either each time or once every several times. For example, with repeated growth of 3 mm by a single C-face growth, removal of the polycrystalline sections is preferably carried out every 1 to 2 times, and more preferably each time.

The present inventor has found that the temperature gradient in the surface region of the Si—C solution, and the growth rate of the single crystal with respect to the temperature gradient, each affect the flatness of the growth surface of the SiC single crystal. Particularly during m-face growth in the first step, if the temperature gradient in the surface region of the Si—C solution is reduced to 10° C./cm or below and the ratio of the growth rate of the SiC single crystal with respect to the temperature gradient (single crystal growth rate/temperature gradient) is less than $20 \times 10^{-4}$ cm²/h·° C., then it will be possible to obtain a m-face grown crystal having a flat growth surface, and a SiC single crystal suitable for a seed crystal to be used in subsequent c-face growth can be obtained.

Throughout the present specification, the temperature gradient in the surface region of the Si—C solution is the temperature gradient in the direction perpendicular to the surface of the Si—C solution, which is a temperature gradient where the temperature falls from the interior of the Si—C solution toward the surface of the solution. The temperature gradient can be calculated as the average value obtained by pre-measuring the temperature A on the surface of the Si—C solution which is the low-temperature side, and the temperature B which is the high-temperature side at a prescribed depth from the surface of the Si—C solution in the direction perpendicular to the solution side with a thermocouple before contacting the seed crystal substrate with the Si—C solution, and dividing the temperature difference by the distance between the positions at which temperature A and temperature B were measured. For example, when measuring the temperature gradient between the surface of the Si—C solution and the position at depth D cm from the surface of the Si—C solution in the direction perpendicular to the solution side, calculation can be performed by the following formula:

$$\text{Temperature gradient}(°\ C./cm) = (B - A)/D$$

which is the difference between the surface temperature A of the Si—C solution and the temperature B at a position at depth D cm from the surface of the Si—C solution in the direction perpendicular to the solution side, divided by D cm.

It was found that limiting the temperature gradient in the surface region of the Si—C solution to within the above range during m-face growth in the first step makes it easier to obtain a SiC single crystal having a flat surface. A large temperature gradient near the seed crystal substrate can speed the growth rate for the SiC single crystal, but if the temperature gradient is too large it will be difficult to obtain a flat growth surface.

Since it is necessary to remove off roughened parts when the growth surface has been roughened during m-face growth in the first step, this reduces the area of the seed crystal used for c-face growth in the third step, making it difficult to obtain a c-face grown crystal with a large diameter. In order to obtain a lengthwise m-face grown crystal of high quality, the temperature gradient is preferably adjusted within the range specified above.

The range of adjustment of the temperature gradient is preferably from the surface of the Si—C solution to a depth of 3 mm. In this case, the temperature gradient (° C./cm) in the above formula is the value obtained when the difference between the surface temperature A of the Si—C solution and the temperature B at a position at a depth of 3 mm from the surface of the Si—C solution in the direction perpendicular to the solution side, is divided by 3 mm.

When the range of adjustment of the temperature gradient is too shallow, the range in which the temperature gradient is adjusted will be shallow and the range in which the degree of supersaturation of C is adjusted will also be shallow, often causing growth of the SiC single crystal to be unstable. If the range of adjustment of the temperature gradient is too deep, the range in which the degree of supersaturation of C is adjusted will also be deep, which is effective for stable growth of the SiC single crystal, but in actuality the depth contributing to single crystal growth is very close to the surface of the Si—C solution and therefore it is sufficient to adjust the temperature gradient up to a depth of several mm from the surface. Consequently, in order to accomplish stable SiC single crystal growth and temperature gradient adjustment, it is preferred to adjust the temperature gradient within the depth range specified above.

Adjustment of the temperature gradient in the surface region of the Si—C solution will be described in greater detail below with reference to the accompanying drawings, but it is possible to form the prescribed temperature gradient in the direction perpendicular to the surface of the Si—C solution by adjusting the placement, construction and output of the heating device, such as a high-frequency coil, situated around the crucible of the single crystal production apparatus.

In the present method, during m-face growth in the first step, it is effective to conduct SiC single crystal growth with the ratio (single crystal growth rate/temperature gradient) of the SiC single crystal growth rate (μm/h) with respect to the temperature gradient in the surface region of the Si—C solution (° C./cm) at preferably less than $20 \times 10^{-4}$ cm²/h·° C., and more preferably no greater than $13.3 \times 10^{-4}$ cm²/h·° C. In addition to adjusting the temperature gradient in the surface region of the Si—C solution, limiting the single crystal growth rate with respect to the temperature gradient to the range specified above makes it possible to more stably obtain a SiC single crystal containing virtually no or absolutely no threading screw dislocations, threading edge dislocations or micropipe defects, and having a flat surface.

The growth rate of the SiC single crystal can be adjusted by controlling the degree of supersaturation of the Si—C solution. If the degree of supersaturation of the Si—C solution is increased the SiC single crystal growth rate increases, and if the degree of supersaturation is decreased the SiC single crystal growth rate decreases.

The degree of supersaturation of the Si—C solution can be controlled primarily by the surface temperature of the Si—C solution and the temperature gradient in the surface region of the Si—C solution For example, the degree of supersaturation can be lowered by decreasing the temperature gradient in the surface region of the Si—C solution or the degree of supersaturation can be raised by increasing the temperature gradient in the surface region of the Si—C solution, while maintaining a constant surface temperature of the Si—C solution.

If heat loss through the seed crystal holding shaft is varied, the degree of supersaturation of the Si—C solution near the seed crystal can vary, altering the growth rate of the SiC single crystal. Thus, the thermal conductivity can be modified by selecting the material for the seed crystal holding shaft, and the diameter of the seed crystal holding shaft can also be varied to modify the degree of heat loss, thereby allowing the growth rate of the SiC single crystal to be altered.

The present inventor has further found that when growing a SiC single crystal, increasing the temperature gradient at least one time helps to obtain a SiC single crystal with a greater growth thickness. Particularly during m-face growth in the first step, increasing the temperature gradient at least once can make it easier to obtain a m-face grown crystal with a large thickness, and to obtain a SiC single crystal suitable as a seed crystal to be used for c-face growth in the third step.

In the method of the invention, a c-face is exposed from the m-face grown crystal in the second step and the SiC crystal with the c-face is used as the seed crystal for c-face growth in the third step, and therefore a greater thickness of the m-face grown crystal grown in the first step will allow a SiC crystal having a c-face with greater area to be obtained. The growth thickness of the m-face grown crystal is preferably 3 mm or greater, more preferably 4 mm or greater and even more preferably 5 mm or greater.

As mentioned above, for m-face growth it is more effective to repeatedly carry out growth several times. It was discovered, however, that even when growth is repeated several times, a very long time is necessary when conducting m-face growth to a thickness of 3 to 5 mm or greater, or in some cases, it has not been possible to accomplish crystal growth to greater than a certain thicknesses. While it is not our intention to be constrained by theory, it is believed that the reason for this is that since the SiC single crystal has higher thermal conductivity than the graphite shaft, a greater crystal growth thickness results in a smaller temperature gradient in the interface region between the SiC crystal growth surface and the Si—C solution, and thus a slower crystal growth rate.

Figure 5:
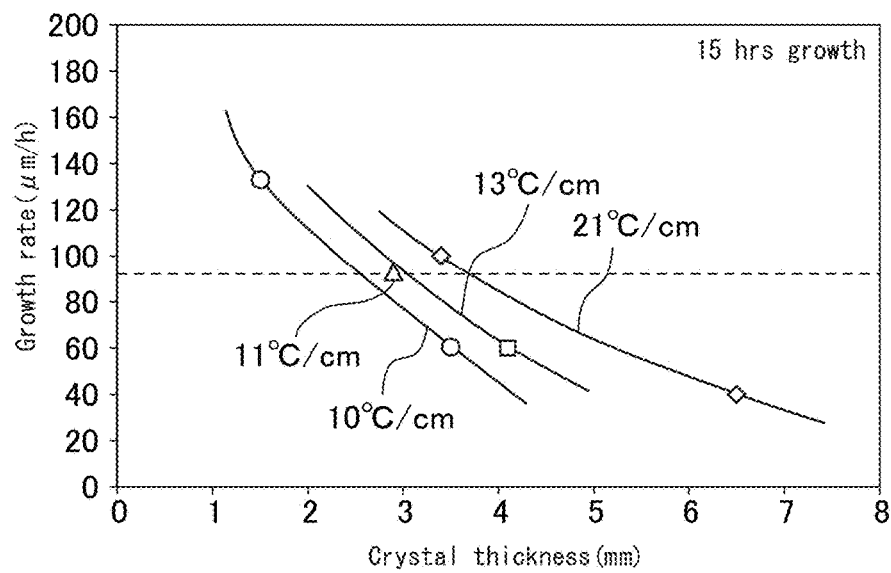
FIG. 5 is a graph showing the relationship between seed crystal substrate thickness and crystal growth rate, depending on temperature gradients in the surface region of the Si—C solution, when SiC crystal growth was continued for 15 hours.

FIG. 5 shows the relationship between crystal thickness and crystal growth rate, depending on a temperature gradient in the surface region of a Si—C solution, when SiC crystal growth was continued for 15 hours with the (1-100) plane as the growth surface. In FIG. 5, the temperature gradient in the surface region of the Si—C solution is the average value of the temperature gradient in a range of 3 mm from the surface of the Si—C solution, the crystal thickness is the thickness of the SiC single crystal used as the seed crystal before initiating growth, and the crystal growth rate is the average crystal growth rate, which is the value of the thickness of the crystal grown for 15 hours divided by 15 hours. From FIG. 5 it is seen that a larger crystal thickness results in a lower crystal growth rate. Also, it is seen that increasing the temperature gradient in the surface region of the Si—C solution can increase the crystal growth rate.

Figure 6:
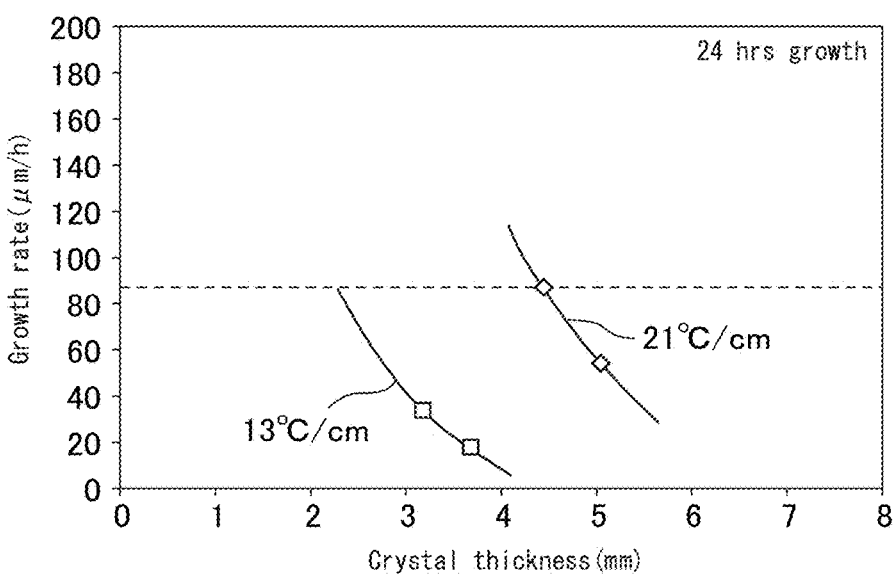
FIG. 6 is a graph showing the relationship between seed crystal substrate thickness and crystal growth rate, depending on temperature gradients in the surface region of the Si—C solution, when SiC crystal growth was continued for 24 hours.

FIG. 6 shows the relationship between crystal thickness and crystal growth rate, depending on a temperature gradient in the surface region of the Si—C solution, under the same conditions as FIG. 5 except that SiC crystal growth was continued for 24 hours with the (1-100) plane as the growth surface. Similar to when SiC crystal growth was continued for 15 hours as in FIG. 5, a greater crystal thickness tended to lower the crystal growth rate.

This tendency was found with m-face growth, and increasing the temperature gradient in the surface region of the Si—C solution by at least one step during m-face growth was found to be effective for obtaining a m-face grown crystal having a large growth thickness. By this method it is possible to more easily obtain a m-face grown crystal with a thickness of preferably 3 mm or greater, more preferably 4 mm or greater, even more preferably 5 mm or greater, yet more preferably 6 mm or greater and even yet more preferably 7 mm or greater.

When the temperature gradient in the surface region of the Si—C solution is increased during m-face growth, the temperature gradient is preferably increased so that the original crystal growth rate is not exceeded. This is because the temperature gradient in the surface region of the Si—C solution is generally set during initial crystal growth so that the highest growth rate is achieved within a range that does not generate inclusions.

For the m-face growth, preferably growth is carried out such that inclusions are not incorporated into the grown crystal. In order to minimize generation of inclusions it is effective to conduct crystal growth at below a prescribed growth rate, and when crystal growth is conducted continuously for 15 hours, it is preferred for the crystal growth to be at an average growth rate of no greater than 93 μm/h, or when crystal growth is conducted continuously for 24 hours, it is more preferred for the crystal growth to be at an average growth rate of no greater than 87 μm/h.

When crystal growth is conducted continuously for 15 hours or 24 hours, the lower limit for the average growth rate of the m-face growth is greater than 0 μm/h, preferably 20 μm/h or greater, more preferably 40 μm/h or greater, even more preferably 60 μm/h or greater and even more preferably 80 μm/h or greater.

The upper limit for the average growth rate of the m-face growth, when crystal growth is conducted continuously for 15 hours, is preferably no greater than 93 μm/h, and may even be no greater than 90 μm/h or no greater than 80 μm/h for an extra margin. The upper limit for the average growth rate of the m-face growth, when crystal growth is conducted continuously for 24 hours, is preferably no greater than 87 μm/h, and may even be no greater than 80 μm/h or no greater than 70 μm/h for an extra margin.

In the method of the invention, it is preferred to increase the temperature gradient in the surface region of the Si—C solution before the growth thickness of the SiC single crystal reaches 4 mm. This is because when crystal growth is conducted continuously, and the growth thickness of the SiC single crystal reaches about 4 mm, the growth rate may be greatly reduced, as shown in FIG. 5 or FIG. 6.

The temperature gradient in the surface region of the Si—C solution may be increased, preferably before the SiC single crystal growth thickness reaches 3 mm, more preferably before it reaches 2 mm and even more preferably before it reaches 1 mm. For example, the temperature gradient may be increased before the growth thickness reaches 1 mm, and then the temperature gradient may be increased before the growth thickness reaches another 1 mm.

When it is not possible to monitor the crystal growth thickness during m-face growth, the relationship between the crystal thickness and crystal growth rate, based on the temperature gradient in the surface region of the Si—C solution, may be determined beforehand, as shown in FIG. 5 or FIG. 6, and the temperature gradient in the surface region of the Si—C solution may be increased in such a manner that the crystal growth rate is at the prescribed level at a timing at which the prescribed crystal thickness is reached.

When the relationship shown in FIG. 5 has been obtained, and for example, if a seed crystal with a 2.6 mm thickness is prepared and growth is conducted for 15 hours at an average growth rate of 93 μm/h with the average temperature gradient at 10° C./cm in a depth range of 3 mm from the surface of the Si—C solution, crystal growth of 1.4 mm takes place, and therefore a crystal thickness of 4.0 mm is obtained. When growth is further continued under these conditions for 15 hours, an average growth rate of only 42 μm/h is obtained, and a total crystal thickness of only 4.6 mm is obtained by crystal growth of 0.6 mm. However if, once a crystal thickness of 4.0 mm has been obtained, the average temperature gradient is increased to 21° C./cm in a depth range of 3 mm from the surface of the Si—C solution, and growth is continued for another 15 hours, then it is possible to accomplish growth at an average growth rate of 85 μm/h and achieve crystal growth of 1.3 mm, to obtain a total crystal thickness of 5.3 mm.

Figure 7:
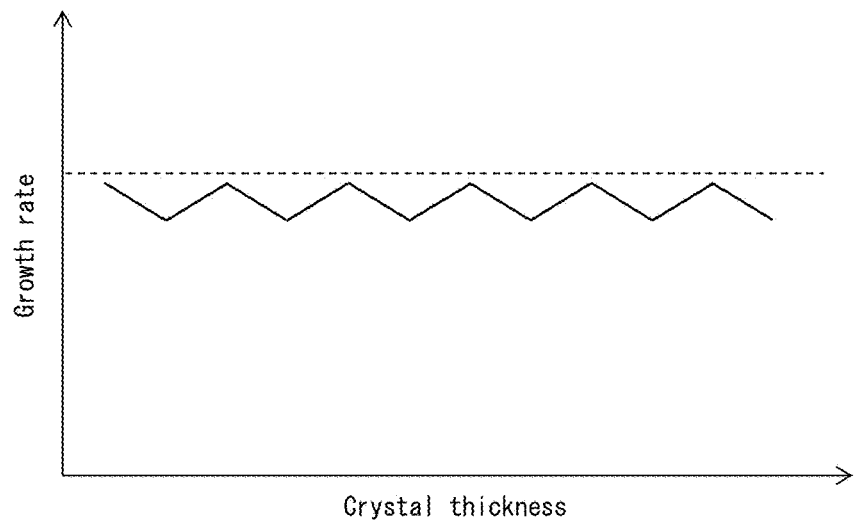
FIG. 7 is a schematic diagram showing the relationship between crystal thickness and crystal growth rate, obtainable according to the invention.

Crystal growth may be conducted, for example, by recording precise data beforehand and setting the program of crystal length (or growth time) and temperature gradient so that an substantially constant crystal growth rate can be obtained in the range up to the upper limit of the growth rate represented by the dashed line, as shown in the schematic view of FIG. 7.

Increasing the temperature gradient in the surface region of the Si—C solution during m-face growth may thus be carried out at least one or more times.

When it is possible to monitor the crystal growth thickness during m-face growth, the crystal growth time may be measured to calculate the crystal growth rate. Feedback may be used to set the temperature gradient in the surface region of the Si—C solution, so as to obtain a prescribed crystal growth rate when the growth rate has fallen. For example, the crystal growth rate may be measured in brief intervals of 1 hour or less or in real time, and the temperature gradient in the surface region of the Si—C solution may be increased in order to maintain a substantially constant growth rate regardless of the crystal growth thickness. This allows crystal growth such as represented in FIG. 7 or crystal growth with a more constant growth rate to be more easily accomplished. When it is possible to measure the crystal growth rate in brief intervals of 1 hour or less or in real time, the upper limit for the growth rate of m-face growth is preferably less than 170 μm/h.

Observation of the presence or absence of inclusions in the SiC crystal can be made based on observation using a microscope. If the grown SiC crystal is sliced to a thickness of about 1.0 to 1.5 mm and observed with light directed from below, the SiC single crystal portion appears transparent while sections containing inclusions appear black, thus allowing the presence or absence of inclusions to be easily discerned. When the presence of inclusions is easily discernible, then the outer appearance of the grown crystal may simply be observed.

The densities of threading screw dislocations, threading edge dislocations, micropipe defects, base plane dislocations and stacking faults in the SiC crystal can be measured by mirror polishing so as to expose the surface inclined in the <1-100> direction from the (0001) plane of the SiC crystal, performing molten alkali etching using molten potassium hydroxide, sodium peroxide or the like to accentuate the dislocations, and observing the etching surface with a microscope. The angle of inclination in the <1-100> direction from the (0001) plane is preferably 2 to 8° and more preferably 3 to 8°, and may be 4°, for example.

Placement of the seed crystal substrate in the single crystal production apparatus may be done by holding the top face of the seed crystal substrate on the seed crystal holding shaft as described above. A carbon adhesive may be used for holding of the seed crystal substrate on the seed crystal holding shaft.

In the method of the invention, when the seed crystal is held on the seed crystal holding shaft during c-face growth in the third step, preferably the carbon sheet is sandwiched between the seed crystal and the seed crystal holding shaft, and bonded with a carbon adhesive.

The seed crystal substrate as the SiC single crystal and the seed crystal holding shaft, such as graphite, have different thermal expansion coefficients, and therefore thermal distortion occurs between the seed crystal substrate and the seed crystal holding shaft during c-face growth, sometimes generating threading dislocations in the grown crystal.

Because a carbon sheet has flexibility, the carbon sheet may be sandwiched between the seed crystal and the seed crystal holding shaft, while holding the seed crystal on the seed crystal holding shaft, to alleviate thermal distortion between the seed crystal and the seed crystal holding shaft during c-face growth, and prevent generation of threading dislocations in the grown crystal.

During m-face growth in the first step as well, a carbon sheet may be sandwiched between the seed crystal substrate and the seed crystal holding shaft while holding the seed crystal substrate on the seed crystal holding shaft. Falling off of the seed crystal substrate may occur during crystal growth due to the difference in thermal expansion coefficients of the seed crystal substrate and the seed crystal holding shaft, but a carbon sheet may be sandwiched between the seed crystal substrate and the seed crystal holding shaft while holding the seed crystal substrate on the seed crystal holding shaft, to prevent falling off of the seed crystal substrate.

The lower limit for the thickness of the carbon sheet is preferably 100 μm, more preferably 300 μm and even more preferably 500 μm, while the upper limit for the thickness of the carbon sheet is preferably 2000 μm, more preferably 1000 μm and even more preferably 700 μm.

The type of carbon sheet is not particularly restricted so long as it has flexibility, and for example, a flexible graphite sheet may be used.

Contact of the seed crystal substrate with the Si—C solution may be carried out by lowering the seed crystal holding shaft holding the seed crystal substrate toward the Si—C solution surface, and contacting it with the Si—C solution while the bottom face of the seed crystal substrate is parallel to the Si—C solution surface. The seed crystal substrate may be held at a prescribed position relative to the Si—C solution surface for growth of the SiC single crystal.

The holding position of the seed crystal substrate may be such that the position of the bottom face of the seed crystal substrate matches the Si—C solution surface, or is below the Si—C solution surface, or is above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. The position of the bottom face of the seed crystal substrate may match the Si—C solution surface or be lower than the Si—C solution surface, but in order to prevent generation of polycrystals, it is preferably such that the Si—C solution does not contact with the seed crystal holding shaft. In such methods, the position of the seed crystal substrate may be adjusted during growth of the single crystal.

The seed crystal holding shaft may be a graphite shaft holding the seed crystal substrate at one end face. The seed crystal holding shaft may have any desired shape, such as cylindrical or columnar, and there may be used a graphite shaft having the same end face shape as the top face of the seed crystal substrate.

According to the invention, a Si—C solution is a solution in which C is dissolved, where the solvent is a molten liquid of Si or Si/X (X being one or more metals other than Si). X is not particularly restricted so long as it is one or more metals and can form a liquid phase (solution) that is in a state of thermodynamic equilibrium with SiC (the solid phase). Suitable examples of X metals include Ti, Mn, Cr, Ni, Ce, Co, V and Fe. The Si—C solution preferably has a composition comprising Si and Cr.

The Si—C solution is more preferably a Si—C solution wherein the solvent is a molten liquid of Si/Cr/X (where X represents one or more metals other than Si and Cr). More preferred is a Si—C solution wherein the solvent is a molten liquid with an atomic composition percentage of Si/Cr/X=30-80/20-60/0-10, as it has low variation in C dissolution. For example, Cr, Ni and the like may be loaded into the crucible in addition to Si, to form a Si—Cr solution, Si—Cr—Ni solution or the like.

The Si—C solution used in the first step and third step of the method of the invention preferably has the same composition. This is because if the composition of the Si—C solution used in the first step and third step differs significantly, new defects may be generated in the grown crystal during the third step.

For the method of the invention, the temperature of the Si—C solution is the surface temperature of the Si—C solution. The lower limit for the temperature of the surface of the Si—C solution is preferably 1800° C. or higher and the upper limit is preferably 2200° C., as the C dissolution in the Si—C solution can be increased within this temperature range. When a n-type SiC single crystal is to be grown, the lower limit for the temperature of the surface of the Si—C solution is preferably 2000° C. or higher from the viewpoint of allowing the amount of nitrogen dissolution in the Si—C solution to be increased.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Figure 8:
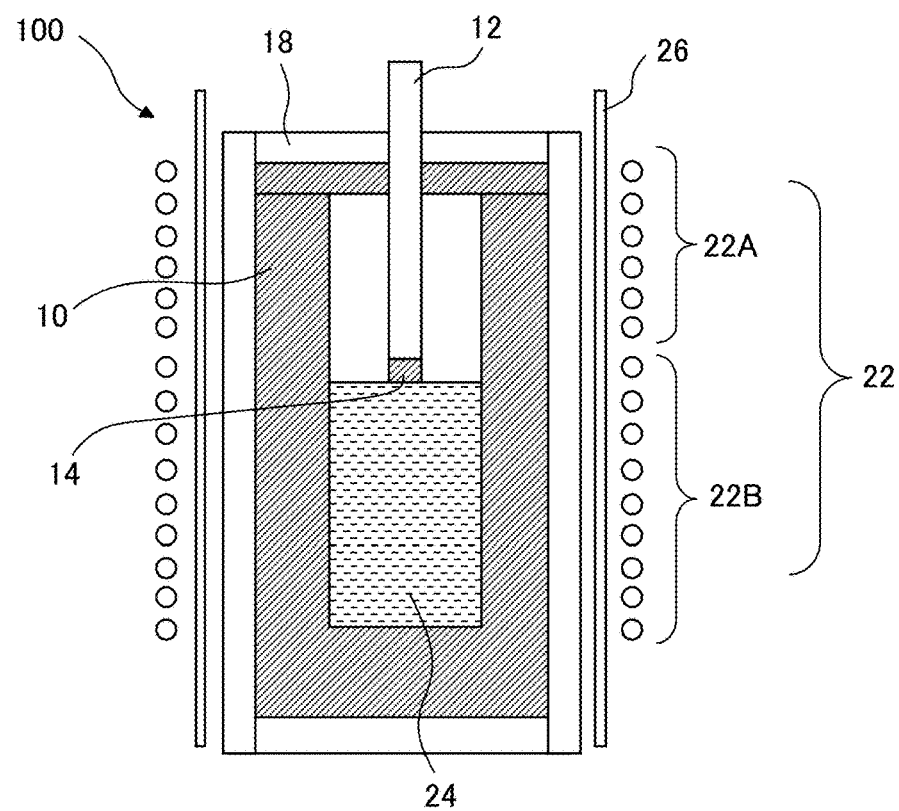
FIG. 8 is a cross-sectional schematic drawing showing a single crystal production apparatus that can be used according to the invention.

FIG. 8 shows an example of a SiC single crystal production apparatus suitable for carrying out the method of the invention. The illustrated SiC single crystal production apparatus 100 comprises a crucible 10, wherein the crucible 10 receives a Si—C solution 24 having C dissolved in a molten liquid of Si or Si/X, a temperature gradient is formed in which the temperature is decreased from the interior of the Si—C solution toward the surface of the solution, and the seed crystal substrate 14 that is held at the tip of the vertically movable graphite shaft 12 is contacted with the Si—C solution 24 to allow growth of the SiC single crystal. The crucible 10 and the graphite shaft 12 are preferably rotated.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby forming a Si—C solution. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B are independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus to Ar, He or the like.

The temperature of the Si—C solution usually has a temperature distribution with a lower temperature at the surface of the SiC solution than the interior thereof due to thermal radiation and the like. Further, a prescribed temperature gradient can be formed in the direction perpendicular to the surface of the Si—C solution 24 so that an upper portion of the solution in which the seed crystal substrate 14 is immersed is at low temperature and a lower portion of the solution is at high temperature, by adjusting the number of coils and spacing of the high-frequency coil 22, the positional relationship of the high-frequency coil 22 and the crucible 10 in the height direction, and the output of the high-frequency coil 22. For example, the output of the upper level coil 22A may be smaller than the output of the lower level coil 22B, to form a prescribed temperature gradient in the Si—C solution 24 in which an upper portion of the solution is at low temperature while a lower portion of the solution is at high temperature.

The C that has dissolved in the Si—C solution 24 is dispersed by diffusion and convection. In the vicinity of the bottom surface of the seed crystal substrate 14, a temperature gradient is formed, in which the temperature is lower compared to a lower portion of the Si—C solution 24, by utilizing the power control of the upper level and lower level of the coil 22, heat radiation from the surface of the Si—C solution 24, and heat loss through the graphite shaft 12. When the C that has dissolved into the lower part of the solution where the temperature and the solubility are high, reaches the region near the bottom face of the seed crystal substrate where the temperature and the solubility are low, a supersaturation state appears and a SiC single crystal is grown on the seed crystal substrate by virtue of supersaturation as a driving force.

In some embodiments, meltback may be carried out in which the surface layer of the SiC seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of the same by dissolution prior to growth of a SiC single crystal is effective for growing a high-quality SiC single crystal. Although the thickness of a layer to be removed depends on processed conditions of the surface of a SiC seed crystal substrate, it is preferably approximately 5 to 50 μm for sufficient removal of an affected layer and a natural oxide layer.

The meltback may be carried out by forming a temperature gradient in which the temperature increases from the interior of the Si—C solution toward the surface of the solution, i.e., by forming, in the Si—C solution, a temperature gradient in a direction opposite to the case of SiC single crystal growth. The temperature gradient in the opposite direction can be formed by adjusting the output of the high-frequency coil.

The meltback can also be carried out, without forming a temperature gradient in the Si—C solution, by simply immersing the seed crystal substrate in the Si—C solution heated to a temperature higher than the liquidus temperature. In that case, the dissolution rate increases with higher Si—C solution temperature, but control of the amount of dissolution becomes difficult, while a low temperature may slow the dissolution rate.

In some embodiments, the seed crystal substrate may be preheated in advance, and then the same is contacted with the Si—C solution. If the seed crystal substrate at a low temperature is contacted with the Si—C solution at high temperature, heat shock dislocations may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the graphite shaft. Alternatively, the Si—C solution may be heated to the temperature for crystal growth after contacting the seed crystal substrate with the Si—C solution at a relatively low temperature. This is also effective for preventing heat shock dislocations and growing a high-quality SiC single crystal.

The present invention relates to a SiC single crystal having density of no greater than $10/cm^2$ each for threading screw dislocations, threading edge dislocations, micropipe defects and base plane dislocations, and stacking fault density of no greater than $10/cm$.

In the SiC single crystal of the invention, the respective densities of threading screw dislocations, threading edge dislocations, micropipe defects and base plane dislocations are each preferably no greater than $5/cm^2$, more preferably no greater than $1/cm^2$ and even more preferably $0/cm^2$, and the density of stacking faults is preferably no greater than $5/cm$, more preferably no greater than $1/cm$ and even more preferably $0/cm$.

In the SiC single crystal of the invention, preferably at least one among the densities of threading screw dislocations, threading edge dislocations, micropipe defects and base plane dislocations (number/$cm^2$) and the density of stacking faults (number/cm) is zero.

The SiC single crystal of the invention is preferably a n-type 4H-SiC single crystal. The dopant may be a nitrogen atom, and the nitrogen density in the SiC single crystal is preferably $1\times10^{18}/cm^3$ to $1\times10^{20}/cm^3$. The nitrogen source may be nitrogen in the crucible atmosphere, nitrogen adsorbed onto the crucible, or the like.

The nitrogen density in the SiC single crystal can be measured by using secondary ion mass spectrometry (SIMS).

When the SiC single crystal of the invention is used as a wafer for epitaxial growth over it, defects are either virtually or completely absent in the wafer, and therefore an epitaxial growth layer containing no defects can be obtained. If the SiC single crystal of the invention is used as a wafer, it is possible to prevent generation of nanopits in the epitaxial growth layer, and to reduce generation of epi defects as well. Consequently, an element formed on the epitaxial growth layer can be obtained at a high yield.

Defects in the epitaxial growth layer can reduce the minority carrier lifetime, but the epitaxial growth layer formed on the SiC single crystal according to the invention, which contains virtually or absolutely no defects, is highly advantageous for obtaining a low-loss bipolar device. Since it contains virtually no or absolutely no defects, such as base plane dislocations, increase in electrical resistance of the bipolar device can be minimized.

EXAMPLES

Examination of Relationship Between Crystal Thickness and Crystal Growth Rate, Depending on Temperature Gradient in Surface Region of Si—C Solution As shown in the following m-face growth Examples 1 to 11, the relationship between crystal thickness and crystal growth rate was examined, with values of 10° C./cm, 11° C./cm, 13° C./cm and 21° C./cm for the temperature gradient wherein the temperature was decreased beforehand from the solution interior toward the solution surface within a range of 3 mm from the solution surface, with a growth time of 15 hours or 24 hours, and with varying crystal thickness, yielding the results shown in FIG. 5 and FIG. 6.

m-Face Growth Example 1

There was prepared a SiC single crystal formed by a sublimation process, which was a cuboid 4H-SiC single crystal with a length of 10 mm, a width of 10 mm and a thickness of 1.5 mm, and the bottom face as the (1-100) plane (onset axis plane), for use as a seed crystal substrate. The top face of the seed crystal substrate was bonded to roughly the center section of the end face of a cylindrical graphite shaft, using a graphite adhesive.

A single crystal production apparatus as shown in FIG. 8 was used, and Si/Cr/Ni were loaded in as molten liquid materials at an atomic composition percentage of 50:40:10, in a graphite crucible for accommodating a Si—C solution 24. The air in the single crystal production apparatus was exchanged with helium. A high-frequency coil 22 situated around the periphery of the graphite crucible 10 was electrified to melt the starting material in the graphite crucible 10 by heating, thereby forming a Si/Cr/Ni alloy molten liquid. Then, a sufficient amount of C was dissolved into the Si/Cr/Ni alloy molten liquid from the graphite crucible 10 to form a Si—C solution 24.

The outputs of the upper level coil 22A and lower level coil 22B were adjusted to heat the graphite crucible 10, forming a temperature gradient in which the temperature was decreased from the interior of the Si—C solution 24 toward the surface of the solution. Formation of the prescribed temperature gradient was confirmed by using a vertically movable thermocouple to measure the temperature of the Si—C solution 24. Outputs of the high-frequency coils 22A and 22B were adjusted so that the temperature of the surface of the Si—C solution 24 was increased to 2000° C., and the temperature gradient, in which the temperature fell from the solution interior toward the solution surface in a range of 3 mm from the solution surface, was 10° C./cm.

Seed touching was conducted, in which the position of the bottom face (m-face) of the seed crystal substrate was placed at a position matching the liquid surface of the Si—C solution, and the bottom face of the seed crystal substrate was contacted with the Si—C solution, while keeping the bottom face of the seed crystal substrate bonded to the graphite shaft in parallel to the Si—C solution surface. The graphite shaft was then pulled upward so that the position of the bottom face of the seed crystal substrate was 1.5 mm above the liquid surface of the Si—C solution. A SiC crystal was grown for 15 hours while maintaining the position of the bottom face of the seed crystal substrate at a 1.5 mm-raised position.

After 15 hours of crystal growth, the graphite shaft was raised, and the seed crystal substrate and the SiC crystal grown from the seed crystal substrate were severed from the Si—C solution and graphite shaft and were recovered. The obtained grown crystal was a single crystal, and had a growth thickness of 2.0 mm. The total thickness of the seed crystal substrate and grown crystal was 3.5 mm. The growth rate was 133 µm/h.

m-Face Growth Example 2

The 3.5 mm-thick SiC crystal obtained in m-face growth Example 1 was used directly as a seed crystal without polishing, to carry out (1-100) plane growth under the same conditions as in m-face growth Example 1.

The obtained grown crystal was a single crystal, and had a growth thickness of 0.9 mm. The total thickness of the seed crystal and grown crystal was 4.4 mm. The growth rate was 60 µm/h.

m-Face Growth Example 3

The 4.4 mm-thick SiC crystal obtained in m-face growth Example 2 was used directly as a seed crystal without polishing, to carry out (1-100) plane growth under the same conditions as in m-face growth Example 1, except that the temperature gradient was 21° C./cm and the growth time was 24 hours.

The obtained grown crystal was a single crystal, and had a growth thickness of 2.1 mm. The total thickness of the seed crystal and grown crystal was 6.5 mm. The growth rate was 87 µm/h.

m-Face Growth Example 4

The 6.5 mm-thick SiC crystal obtained in m-face growth Example 3 was used directly as a seed crystal without polishing, to carry out (1-100) plane growth under the same conditions as in m-face growth Example 1, except that the temperature gradient was 21° C./cm.

The obtained grown crystal was a single crystal, and had a growth thickness of 0.6 mm. The total thickness of the seed crystal and grown crystal was 7.1 mm. The growth rate was 40 µm/h.

m-Face Growth Example 5

There was prepared a SiC single crystal formed by a sublimation process, which was a cuboid 4H-SiC single crystal with a length of 10 mm, a width of 10 mm and a thickness of 1.5 mm, and the bottom face as the (1-100) plane (onset axis plane), for use as a seed crystal substrate. There was conducted (1-100) plane growth under the same conditions as in m-face growth Example 1, except that the temperature gradient was 13° C./cm and the growth time was 10 hours.

The obtained grown crystal was a single crystal, and had a growth thickness of 1.7 mm. The total thickness of the seed crystal substrate and grown crystal was 3.2 mm. The growth rate was 170 µm/h.

m-Face Growth Example 6

The 3.2 mm-thick SiC crystal obtained in m-face growth Example 5 was used directly as a seed crystal without polishing, to carry out (1-100) plane growth under the same conditions as in m-face growth Example 5, except that the growth time was 24 hours.

The obtained grown crystal was a single crystal, and had a growth thickness of 0.8 mm. The total thickness of the seed crystal substrate and grown crystal was 4.0 mm. The growth rate was 33 µm/h.

m-Face Growth Example 7

The growth surface of the SiC crystal obtained in en-face growth Example 6 was mirror polished to obtain a SiC crystal with a thickness of 3.7 mm, which was used as a seed crystal to carry out (1-100) plane growth under the same conditions as in m-face growth Example 5, except that the growth time was 24 hours.

The obtained grown crystal was a single crystal, and had a growth thickness of 0.4 mm. The total thickness of the seed crystal substrate and grown crystal was 4.1 mm. The growth rate was 17 µm/h.

m-Face Growth Example 8

The 4.1 mm-thick SiC crystal obtained in m-face growth Example 7 was used directly as a seed crystal without polishing, to carry out (1-100) plane growth under the same conditions as in m-face growth Example 5, except that the growth time was 15 hours.

The obtained grown crystal was a single crystal, and had a growth thickness of 0.9 mm. The total thickness of the seed crystal substrate and grown crystal was 5.0 mm. The growth rate was 60 µm/h.

m-Face Growth Example 9

The 5.0 mm-thick SiC crystal obtained in m-face growth Example 8 was used directly as a seed crystal without polishing, to carry out (1-100) plane growth under the same conditions as in m-face growth Example 5, except that the temperature gradient was 21° C./cm and the growth time was 24 hours.

The obtained grown crystal was a single crystal, and had a growth thickness of 1.3 mm. The total thickness of the seed crystal substrate and grown crystal was 6.3 mm. The growth rate was 54 µm/h.

m-Face Growth Example 10

There was prepared a SiC single crystal formed by a sublimation process, which was a cuboid 4H-SiC single crystal with a length of 10 mm, a width of 10 mm and a thickness of 3.4 mm, and the bottom face as the (1-100) plane (onset axis plane), for use as a seed crystal substrate. There was conducted (1-100) plane growth under the same conditions as in m-face growth Example 1, except that the temperature gradient was 21° C./cm.

The obtained grown crystal was a single crystal, and had a growth thickness of 1.5 mm. The total thickness of the seed crystal substrate and grown crystal was 4.9 mm. The growth rate was 100 µm/h.

m-Face Growth Example 11

There was prepared a SiC single crystal formed by a sublimation process, which was a cuboid 4H-SiC single crystal with a length of 10 mm, a width of 10 mm and a thickness of 2.9 mm, and the bottom face as the (1-100)

plane (onset axis plane), for use as a seed crystal substrate. There was conducted (1-100) plane growth under the same conditions as in m-face growth Example 1, except that the temperature gradient was 11° C./cm.

The obtained grown crystal was a single crystal, and had a growth thickness of 1.4 mm. The total thickness of the seed crystal substrate and grown crystal was 4.3 mm. The growth rate was 93 μm/h.

(Evaluation of Threading Dislocation Density)

The threading dislocation densities of the SiC single crystals grown in m-face growth Examples 1 to 11 were measured.

The SiC single crystals grown in m-face growth Examples 1 to 11 were each sliced in a lamellar fashion to a 1 mm thickness by using a diamond saw, so as to expose a plane inclined at 4° from the (0001) plane in the <1-100> direction, and the sliced crystals were polished with two different diamond slurries (slurry particle diameters: 6 μm and 3 μm) for mirror finishing. Next, each SiC single crystal was immersed for 5 minutes in a 510° C. molten liquid comprising a mixture of potassium hydroxide (product of Nacalai Tesque, Inc.) and sodium peroxide (product of Wako Pure Chemical Industries, Ltd.), for etching. Similarly, the SiC single crystal fabricated by a sublimation process and used as the seed crystal substrate was also etched on the plane inclined at 4° from the (0001) plane in the <1-100> direction. Each etched SiC single crystal was removed from the mixed molten liquid and subjected to ultrasonic cleaning in purified water, after which a microscope (product of Nikon Corp.) was used to observe threading dislocations. The SiC single crystals continuously grown in m-face growth Examples 1 to 4 were continuous crystals, and since the grown thickness in each example was known, the threading dislocation density of the section grown in each example was analyzed. The threading dislocation densities of each of the SiC single crystals grown in en-face growth Examples 5 to 9 were also analyzed in the same manner.

Even though threading dislocation was detected on the etching surface of the seed crystal substrate, no threading dislocation was detected on the etching surfaces of the SiC single crystals grown in m-face growth Examples 1 to 11.

(Observation of Presence/Absence of Inclusions)

The presence/absence of inclusions in the SiC single crystals grown in m-face growth Examples 1 to 11 was evaluated. The SiC single crystal used for measurement of the threading dislocation density was irradiated with light from below and observed with a microscope, and a cross-sectional transmission image was observed.

Figure 16:
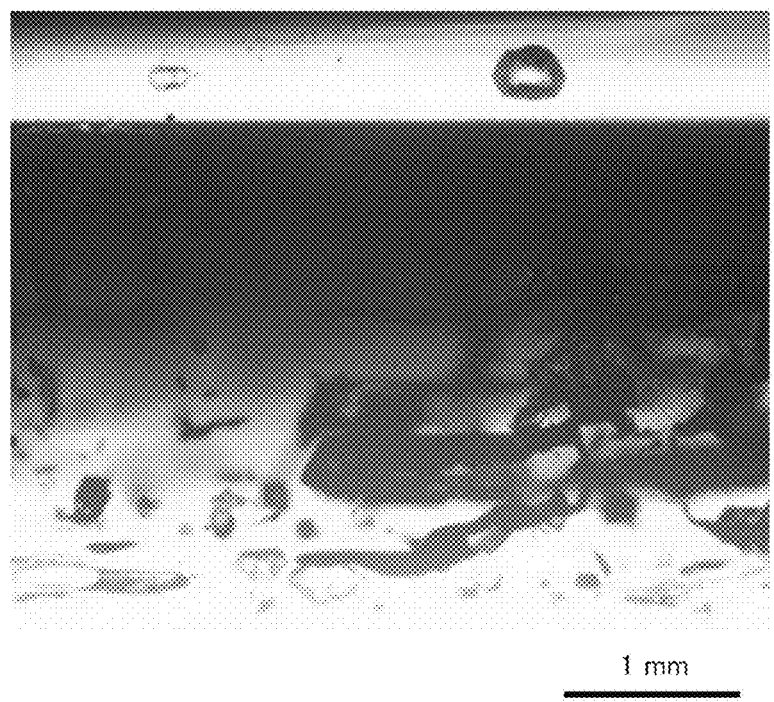
FIG. 16 is a cross-sectional transmission image of a SiC crystal grown in the Example.
Figure 17:
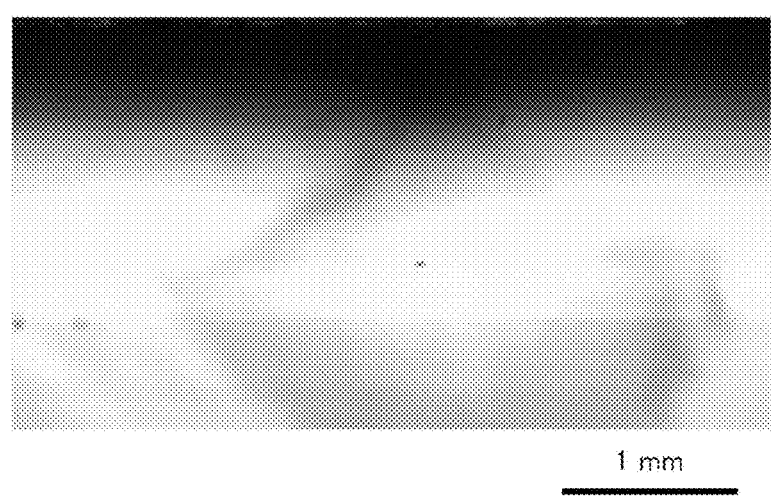
FIG. 17 is a cross-sectional transmission image of a SiC crystal grown in the Example.

FIG. 16 shows a cross-sectional transmission image of the SiC crystal grown in m-face growth Example 1. As shown in FIG. 16, the SiC crystal grown in m-face growth Example 1 contained inclusions. FIG. 17 shows a cross-sectional transmission image of the SiC crystal grown in m-face growth Example 2. As shown in FIG. 17, the SiC crystal grown in m-face growth Example 2 did not contain inclusions. Table 2 below shows the results of observing the presence/absence of inclusions in the SiC crystals grown in m-face growth Examples 3 to 11.

Table 2 summarizes the growth conditions for m-face growth Examples 1 to 11, as well as the grown crystal thicknesses, growth rates, threading dislocation densities and presence/absence of inclusions.

TABLE 2

Growth conditions, grown crystal thicknesses, growth rates, threading dislocation densities and presence/absence of inclusions for m-face grown Examples 1 to 11

| | Seed crystal thickness (mm) | Temperature gradient (° C./cm) | Growth time (h) | Growth thickness (mm) | Growth rate (μm/h) | Threading dislocation density (num/cm$^2$) | Presence/absence of inclusions |
|---|---|---|---|---|---|---|---|
| Example 1 | 1.5 | 10 | 15 | 2.0 | 133 | 0 | Present |
| Example 2 | 3.5 | 10 | 15 | 0.9 | 60 | 0 | Absent |
| Example 3 | 4.4 | 21 | 24 | 2.1 | 87 | 0 | Absent |
| Example 4 | 6.5 | 21 | 15 | 0.6 | 40 | 0 | Absent |
| Example 5 | 1.5 | 13 | 10 | 1.7 | 170 | 0 | Present |
| Example 6 | 3.2 | 13 | 24 | 0.8 | 33 | 0 | Absent |
| Example 7 | 3.7 | 13 | 24 | 0.4 | 17 | 0 | Absent |
| Example 8 | 4.1 | 13 | 15 | 0.9 | 60 | 0 | Absent |
| Example 9 | 5.0 | 21 | 24 | 1.3 | 54 | 0 | Absent |
| Example 10 | 3.4 | 21 | 15 | 1.5 | 100 | 0 | Present |
| Example 11 | 2.9 | 11 | 15 | 1.4 | 93 | 0 | Absent |

FIG. 5 shows the relationship between seed crystal thickness and crystal growth rate for 15 hours of growth in m-face growth Examples 1, 2, 4, 8, 10 and 11. FIG. 6 shows the relationship between seed crystal thickness and crystal growth rate for 24 hours of growth in m-face growth Examples 3, 6, 7 and 9.

For m-face growth, increasing the crystal thickness produced a tendency toward a lower crystal growth rate, but a higher temperature gradient in the surface region of the Si—C solution allowed the growth rate to be increased.

Example 1

First Step (Preparation Step)

There was prepared a SiC single crystal formed by a sublimation process, which was a cuboid 4H-SiC single crystal with a length of 10 mm, a width of 10 mm and a thickness of 1.5 mm, and the (11-20) plane, (-1-120) plane, (0001) plane and (000-1) plane as side faces, and the (1-100) plane (onset axis plane) as the bottom face, for use as a seed crystal substrate. The top face of the seed crystal substrate was bonded to roughly the center section of the end face of a cylindrical graphite shaft, using a graphite adhesive.

A single crystal production apparatus as shown in FIG. 8 was used, and Si/Cr/Ni were loaded in as molten liquid materials at an atomic composition percentage of 50:40:10, in a graphite crucible for accommodating a Si—C solution 24. The air in the single crystal production apparatus was exchanged with helium. The nitrogen adsorption in the graphite crucible was 100 wtppm, and no nitrogen was intentionally added to the helium atmosphere. A high-frequency coil 22 situated around the periphery of the graphite crucible 10 was electrified to melt the starting material in the graphite crucible 10 by heating, thereby forming a Si/Cr/Ni alloy molten liquid. Then, a sufficient amount of C was dissolved into the Si/Cr/Ni alloy molten liquid from the graphite crucible 10 to form a Si—C solution 24.

The outputs of the upper level coil 22A and lower level coil 22B were adjusted to heat the graphite crucible 10, forming a temperature gradient in which the temperature was decreased from the interior of the Si—C solution 24 toward the surface of the solution. Formation of the prescribed temperature gradient was confirmed by using a vertically movable thermocouple to measure the temperature of the Si—C solution 24. Outputs of the high-frequency coils 22A and 22B were adjusted so that the temperature of the surface of the Si—C solution 24 was increased to 2000° C., and the temperature gradient, in which the temperature fells from the solution interior in a range of 3 mm from the solution surface toward the solution surface, was 7° C./cm.
(Step (1-A))

Seed touching was conducted, in which the position of the bottom face (m-face) of the seed crystal substrate was placed at a position matching the liquid surface of the Si—C solution, and the bottom face of the seed crystal substrate was contacted with the Si—C solution, while keeping the bottom face of the seed crystal substrate bonded to the graphite shaft parallel to the Si—C solution surface. The graphite shaft was then pulled upward so that the position of the bottom face of the seed crystal substrate was 1.5 mm above the liquid surface of the Si—C solution. A SiC crystal was grown for 15 hours while maintaining the position of the bottom face of the seed crystal substrate at a 1.5 mm-raised position.

After 15 hours of crystal growth, the graphite shaft was raised, and the seed crystal substrate and the SiC crystal grown from the seed crystal substrate were severed from the Si—C solution and graphite shaft and were recovered. The obtained grown crystal was a single crystal, the growth occurring with widening diameter with respect to the bottom face of the seed crystal substrate, having a diameter of 13 mm and a thickness of 1.4 mm (excluding the thickness of the seed crystal substrate fabricated by a sublimation process, same hereunder). The total thickness of the seed crystal substrate and grown crystal was 2.9 mm. The diameter of the grown crystal is the diameter of the maximum inscribed circle on the growth surface, and the thickness of the grown crystal is the thickness of the grown crystal at the center section of the growth surface (same hereunder). The growth rate was 93 μm/h.

Figure 9:
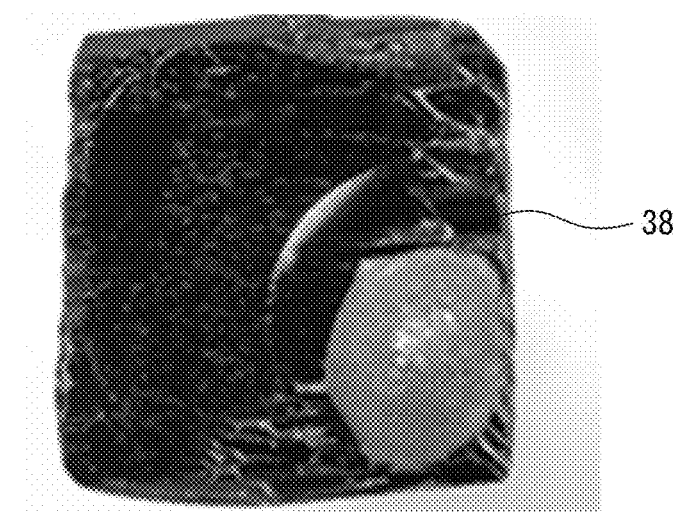
FIG. 9 is a photograph showing a SiC crystal obtained by a first time of conducting step (A) of the first step in Example 1, as observed from the growth surface.

FIG. 9 shows a photomicrograph of the crystal obtained in step (1-A), as observed from the growth surface. The center section of the growth surface of the obtained crystal was flat and a SiC single crystal was obtained, with polycrystalline sections visible at sections of the outer peripheral section of the growth surface (the widened diameter sections). The solidified Si—C solution was drawn to the polycrystalline sections seen in part of the outer peripheral section of the grown crystal, and no cracking was seen in the grown SiC single crystal.
(Step (1-B), 1st Time)

The grown crystal obtained in step (1-A) was cut by dicing using a diamond blade so as to remove the widened parts in the <11-20> direction on the side faces with respect to the growth direction of the grown crystal, thereby removing the polycrystalline sections. No polycrystalline sections were found on the (0001) plane or (000-1) plane, and no cutting out was performed for these. The two side faces of the cut surfaces were then mirror polished.
(Step (1-C), 1st Time)

The crystal obtained in step (1-B) was used as the seed crystal. The output of the high-frequency coil 22 was adjusted so that the temperature gradient in which the temperature fell from the solution interior in a range of 3 mm from the solution surface toward the solution surface, was 15° C./cm. Seed touching was conducted, in which the position of the bottom face (m-face) of the seed crystal was placed at a position matching the liquid surface of the Si—C solution, and the bottom face of the seed crystal substrate was contacted with the Si—C solution, and then the graphite shaft was raised up so that the position of the bottom face of the seed crystal was a position 1.5 mm above the liquid surface of the Si—C solution. Thus, the crystal obtained in step (1-B) was used as the seed crystal to carry out m-face crystal growth under the same conditions as step (1-A), except that the temperature gradient was 15° C./cm and the growth time was 24 hours.

Upon completion of the crystal growth, the graphite shaft was raised and the seed crystal and the SiC crystal grown from the seed crystal were severed from the Si—C solution and the graphite shaft and were recovered. The obtained grown crystal had a diameter of 12 mm and a total thickness of 3.1 mm (growth thickness: 1.7 mm). The growth rate was 70 μm/h.
(Step (1-B), 2nd Time)

The grown crystal obtained in step (1-C), 1st time was cut by dicing using a diamond blade so as to remove the widened parts in the <11-20> direction on the side faces with respect to the growth direction of the grown crystal, thereby removing the polycrystalline sections. No polycrystalline sections were found on the (0001) plane or (000-1) plane, and no cutting out was performed for these. The two side faces as the cut surfaces were then mirror polished, and the growth surface was also mirror polished, to obtain a grown crystal with a thickness of 2.9 mm.
(Step (1-C), 2nd Time)

The grown crystal obtained in step (1-B), 2nd time was used as the seed crystal to carry out m-face crystal growth under the same conditions as step (1-C), 1st time, except that the growth time was 15 hours.

Upon completion of the crystal growth, the graphite shaft was raised and the seed crystal and the SiC crystal grown from the seed crystal were severed from the Si—C solution and the graphite shaft and were recovered. The obtained grown crystal had a diameter of 11 mm and a total thickness of 3.7 mm (growth thickness: 0.8 mm). The growth rate was 53 μm/h.
(Step (1-B), 3rd Time)

The grown crystal obtained in step (1-C), 2nd time was cut by dicing using a diamond blade so as to remove the widened parts in the <11-20> direction on the side faces with respect to the growth direction of the grown crystal, thereby removing the polycrystalline sections. No polycrystalline sections were found on the (0001) plane or (000-1) plane, and no cutting out was performed for these. The two side faces as the cut surfaces were then mirror polished, and the growth surface was also mirror polished, to obtain a grown crystal with a thickness of 3.6 mm.
(Step (1-C), 3rd Time)

The grown crystal obtained in step (1-B), 3rd time was used as the seed crystal to carry out m-face crystal growth under the same conditions as step (1-C), 1st time, except that the temperature gradient, wherein the temperature decreased from the solution interior toward the solution surface in a range of 3 mm from the solution surface, was 21° C./cm, and the growth time was 15 hours.

Upon completion of the crystal growth, the graphite shaft was raised and the seed crystal and the SiC crystal grown from the seed crystal were severed from the Si—C solution and the graphite shaft and were recovered. The obtained grown crystal had a diameter of 11 mm and a total thickness of 4.6 mm (growth thickness: 0.9 mm). The growth rate was 60 μm/h.

Table 3 shows the growth conditions for the first step in Example 1 and the thickness of the obtained grown crystal.

TABLE 3

| Step | Temperature gradient (° C./cm) | Growth time (h) | Growth thickness (mm) | Total growth thickness (mm) | Growth rate (μm/h) |
|---|---|---|---|---|---|
| (1-A) | 7 | 15 | 1.4 | 1.4 | 93 |
| (1-C) 1st time | 15 | 24 | 1.7 | 3.1 | 70 |
| (1-C) 2nd time | 15 | 15 | 0.8 | 3.7 | 53 |
| (1-C) 3rd time | 21 | 15 | 0.9 | 4.6 | 60 |

Figure 10:
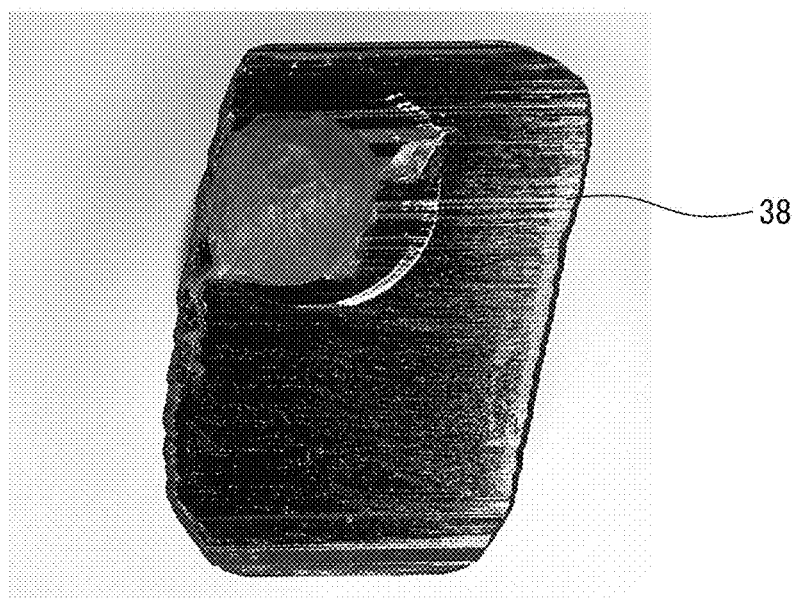
FIG. 10 is a photograph showing the SiC crystal obtained by the first step in Example 1, as observed from the growth surface.

FIG. 10 shows a photomicrograph of the grown crystal obtained in the first step, as observed from the growth surface. The center section of the growth surface of the obtained grown crystal was flat and a SiC single crystal was obtained, with no inclusions visible from external observation.

Second Step

The seed crystal section was cut out from the grown crystal obtained in the first step and removed, and the onset axis plane of the (000-1) plane of the obtained grown crystal was cut out and mirror polished to obtain a cuboid SiC single crystal having a length of 4.5 mm, a width of 10 mm and a thickness of 1 mm.

Third Step

The SiC single crystal with the (000-1) plane obtained in the second step was used as the seed crystal. A 600 μm-thickness carbon sheet (flexible graphite sheet, GRAFOIL, product of Graftech) was sandwiched between the seed crystal and the graphite shaft, and the top face of the seed crystal was bonded to approximately the center section of the end face of the graphite shaft using a graphite adhesive, so that the (000-1) plane of the seed crystal was the bottom face.

The single crystal production apparatus shown in FIG. 8 was used, and a SiC single crystal was grown in the same manner as step (1-A) in the first step, except that the output of the high-frequency coil 22 was adjusted so that the temperature on the surface of the Si—C solution was raised to 2000° C. and the temperature gradient, in which temperature fell from the solution interior to the solution surface in a range of 3 mm from the solution surface, was 20.0° C./cm, and the seed crystal substrate was held for 10 hours under those output conditions to grow a crystal on the (000-1) plane (C-face).

Upon completion of crystal growth of the (000-1) plane, the graphite shaft was raised and the seed crystal and the SiC crystal grown from the seed crystal were severed from the Si—C solution and the graphite shaft and were recovered. The obtained grown crystal was a single crystal, the growth occurring with widening diameter with respect to the bottom face of the seed crystal, having a diameter of 11 mm and a growth thickness of 4.0 mm (excluding the thickness of the seed crystal). The growth rate was 400 μm/h. The growth surface of the obtained single crystal was flat.

(Measurement of Threading Dislocation Density)

The SiC single crystal grown in Example 1 was cut with a diamond saw, so as to expose a plane inclined at 4° from the (0001) plane in the <1-100> direction, at a position of 1 mm from the growth surface of the center section excluding the widened diameter section, and was polished with two different diamond slurries (slurry particle diameters: 6 μm and 3 μm) for mirror finishing. Next, each SiC single crystal was immersed for 5 minutes in a 510° C. molten liquid comprising a mixture of potassium hydroxide (product of Nacalai Tesque, Inc.) and sodium peroxide (product of Wako Pure Chemical Industries, Ltd.), for etching. Similarly, the SiC single crystal fabricated by a sublimation process and used as the seed crystal substrate was also etched on the plane inclined at 4° from the (0001) plane in the <1-100> direction. Each of the etched SiC single crystals was removed from the molten liquid mixture and subjected to ultrasonic cleaning in purified water, and a microscopy (product of Nikon Corp.) was used for observation of threading screw dislocations, threading edge dislocations, micropipe defects, base plane dislocations and stacking faults.

Figure 11:
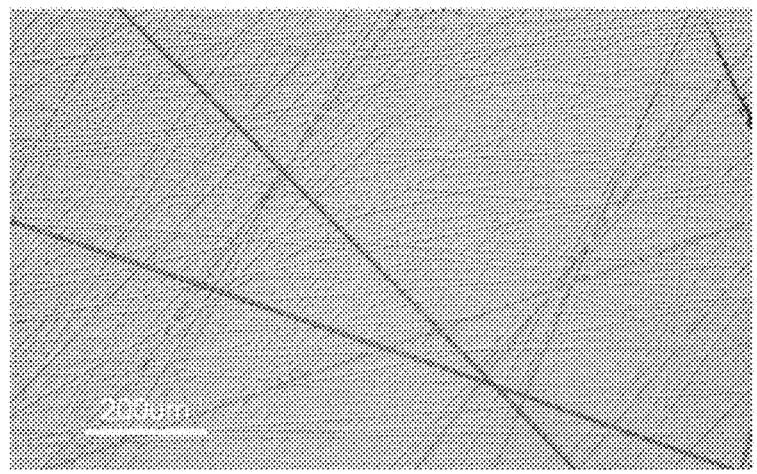
FIG. 11 is a photomicrograph of the molten alkali-etched surface of the SiC crystal grown in Example 1.
Figure 12:
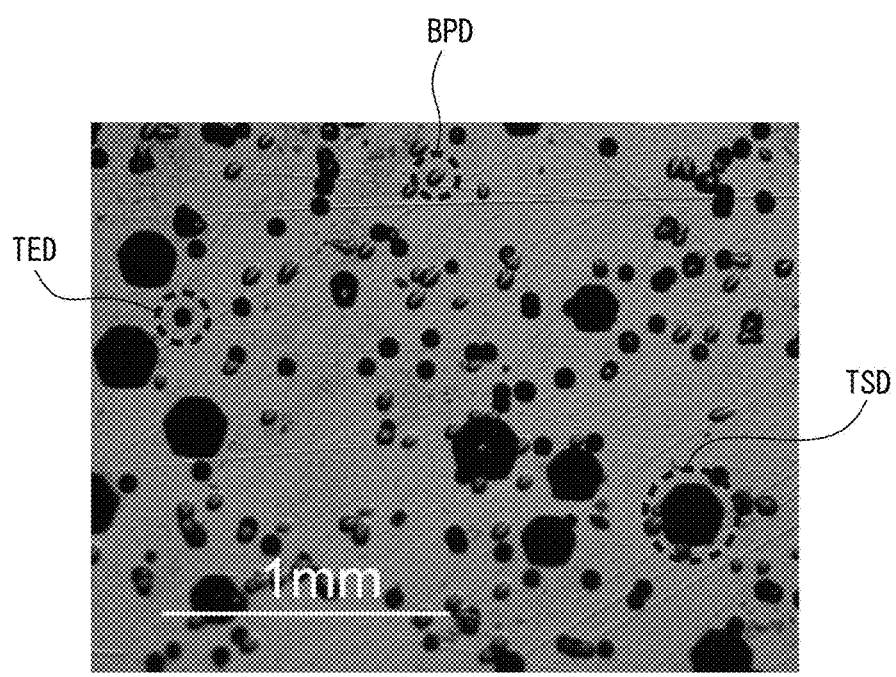
FIG. 12 is a photomicrograph of the molten alkali-etched surface of a SiC single crystal grown by a sublimation process, used as the seed crystal substrate in Example 1.

FIG. 11 is a photomicrograph of the etching surface of the SiC single crystal grown in Example 1. FIG. 12 is a photomicrograph of the etching surface of the SiC single crystal fabricated by a sublimation process and used as the seed crystal substrate in Example 1.

In the etching surface of the seed crystal substrate of FIG. 12 there were detected threading screw dislocations (TSD), threading edge dislocations (TED) and base plane dislocations (BPD), but in the etching surface of the grown crystal of FIG. 11, no threading screw dislocations, threading edge dislocations, micropipes, base plane dislocations or stacking faults were detected.

(Observation of Presence/Absence of Inclusions)

The presence/absence of inclusions in the SiC single crystal grown in Example 1 was evaluated. The SiC single crystal used for measurement of the threading dislocation density was observed with a microscope with light irradiated from below, and upon observing the cross-sectional transmission image, the SiC crystal grown in Example 1 was found to contain no inclusions.

The nitrogen density in the grown crystal was measured by secondary ion mass spectrometry (SIMS, product of Cameca). The reference sample used was a sample comprising N ion-implanted into a SiC substrate. The nitrogen density of the grown crystal was $2 \times 10^{19}/cm^3$.

Example 2

First Step (Step (2-A))

In this example, (1-100) plane growth was conducted in the same manner as Example 1-first step-step (1-A), except that the temperature gradient, in which the temperature was decreased from the solution interior toward the surface of the Si—C solution in a range of 3 mm from the solution surface, was 15.0° C./cm, the seed crystal substrate was immersed into the Si—C solution for seed touching to a depth so that the graphite shaft was wetted with the Si—C solution, and the graphite shaft was then raised up and held so that the position of the bottom face of the seed crystal substrate was at a position 1.5 mm above the liquid surface of the Si—C solution, and the grown crystal was collected and externally observed.

Figure 13:
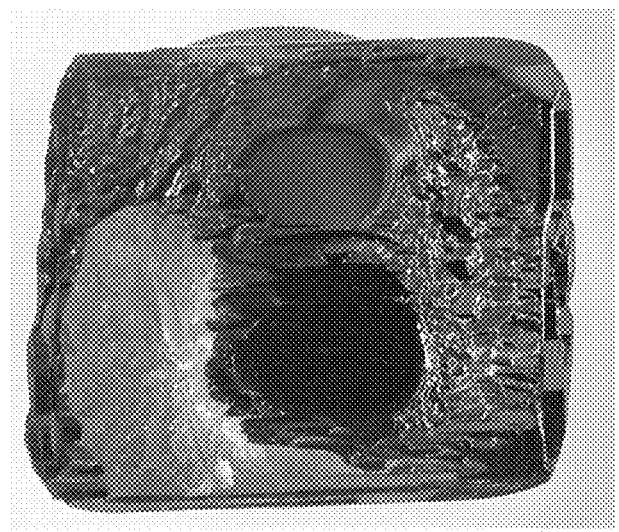
FIG. 13 is a photograph showing a SiC crystal obtained by a first time of conducting step (A) of the first step in Example 2, as observed from the growth surface.

The obtained grown crystal had a diameter of 11 mm and a thickness of 2.2 mm (excluding the thickness of the seed crystal substrate). The growth rate was 147 μm/h. FIG. 13 shows a photograph of the grown crystal observed from the growth surface. Although the obtained crystal was a single crystal, the growth surface was rough as seen in FIG. 13, a flat surface could not be obtained, and inclusions were visible. Also, polycrystalline sections were seen on the outer peripheral section (widened diameter section) of the growth surface. The thickness of the roughened part of the growth surface was 0.5 mm, and the roughened part was removed by polishing.

(Step (2-B), 1st Time)

Next, the grown crystal from which the roughened part had been removed was cut by dicing using a diamond blade so as to remove the widened sections in the <11-20> direction on the side faces with respect to the growth direction of the grown crystal and in the direction parallel to the (000-1) plane, thereby removing the polycrystalline sections. On the (0001) plane, the polycrystalline sections were left without being cut out. The three side faces as the cut surfaces and the growth surface were then mirror polished.

(Step (2-C), 1st Time)

Next, (1-100) plane growth was conducted under the same conditions as Example 1-first step-step (1-C), except that the temperature gradient, in which temperature was decreased from the solution interior toward the surface of the Si—C solution in a range of 3 mm from the solution surface, was 15.0° C./cm.

The obtained grown crystal was subjected to removal of the roughened parts of the growth surface by polishing in the same manner as step (2-A). Removal of the polycrystalline sections, mirror polishing and m-face crystal growth were then carried out under the same conditions as the 2nd-3rd time of step (1-B) of Example 1 and the 2nd-3rd time of step (1-C).

Upon completion of the crystal growth, the graphite shaft was raised and the seed crystal and the SiC crystal grown from the seed crystal were severed from the Si—C solution and the graphite shaft and were recovered. The obtained grown crystal had a diameter of 11 mm and a total thickness of 2.0 mm.

Table 4 shows the growth conditions for the first step in Example 2 and the thickness of the obtained grown crystal.

TABLE 4

Growth conditions of first step in Example 2, and thickness of obtained grown crystal

| Step | Temperature gradient (° C./cm) | Growth time (h) | Growth thickness (mm) | Total growth thickness (mm) | Growth rate (μm/h) |
|---|---|---|---|---|---|
| (2-A) | 15 | 15 | 2.2 | 2.2 | 144 |
| (2-C) 1st time | 15 | 24 | 0.8 | 2.5 | 33 |
| (2-C) 2nd time | 15 | 15 | 1.0 | 3.4 | 67 |
| (2-C) 3rd time | 21 | 15 | 0.8 | 4.2 | 53 |

(The total growth thicknesses from step (2-C), 1st time and step (2-C), 2nd time are, respectively, the value after 0.5 mm polishing after step (2-A) and the value after 0.1 mm polishing after step (2-C), 1st time.)

The center section of the growth surface of the grown crystal obtained in the first step was flat and a SiC single crystal was obtained, but inclusions were present in a portion thereof. Polycrystalline sections were generated on the outer peripheral section of the growth surface, corresponding to the location where polycrystalline sections were left in step (2-B), the solidified Si—C solution was drawn to the polycrystalline sections, and no cracking of the grown SiC single crystal was observed.

Second Step

In the same manner as the second step of Example 1, the seed crystal section was cut out from the grown crystal obtained in the first step and removed, and the (000-1) plane of the obtained grown crystal was cut out and mirror polished to obtain a cuboid SiC single crystal having a length of 3.5 mm, a width of 9.0 mm and a thickness of 1.0 mm.

Third Step

Crystal growth of the (000-1) plane was conducted using the crystal obtained in the second step as the seed crystal under the same conditions as the third step of Example 1, and the grown SiC crystal was cut out from the Si—C solution and graphite shaft and was collected. The obtained grown crystal was a single crystal, the growth occurring with widening diameter with respect to the bottom face of the seed crystal, having a diameter of 5 mm and a thickness of 3.8 mm (excluding the thickness of the seed crystal). The growth rate was 382 μm/h.

Next, in the same manner as Example 1, a plane inclined at 4° from the (0001) plane in the <1-100> direction was cut out, and subjected to mirror polishing, etching and observation of threading screw dislocations, threading edge dislocations, micropipe defects, base plane dislocations and stacking faults. No threading screw dislocations, threading edge dislocations, micropipes, base plane dislocations or stacking faults were detected in the etching surface of the grown crystal obtained in this example, and therefore no defects were present. Moreover, no inclusions were present in the crystal grown in the third step of this example.

The nitrogen density in the grown crystal was measured by secondary ion mass spectrometry (SIMS, product of Cameca). The reference sample used was a sample comprising N ion-implanted into a SiC substrate. The nitrogen density of the grown crystal was $2 \times 10^{19}/cm^3$.

Example 3

There was conducted (1-100) plane growth in the same manner as the first step of Example 1, except that in the first step of this example, the output of the high-frequency coil 22 was adjusted so that the temperature gradient, in which the temperature was decreased from the solution interior toward the solution surface within a region of 3 mm from the solution surface, was 10° C./cm, and during repeated growth of the m-face, growth was carried out a total of 4 times, for 15 hours, 24 hours, 15 hours and 15 hours, i.e. 69 hours, without changing the temperature gradient setting, and the grown crystal was collected.

The obtained grown crystal was a single crystal, the growth occurring with widening diameter with respect to the bottom face of the seed crystal substrate, having a diameter of 12 mm and a thickness of 3.2 mm (excluding the thickness of the seed crystal substrate).

Table 5 shows the growth conditions for the first step in Example 3 and the thickness of the obtained grown crystal.

TABLE 5

| Step | Temperature gradient (° C./cm) | Growth time (h) | Growth thickness (mm) | Total growth thickness (mm) | Growth rate (μm/h) |
|---|---|---|---|---|---|
| (3-A) | 10 | 15 | 1.8 | 1.8 | 120 |
| (3-C) 1st time | 10 | 24 | 0.5 | 2.3 | 20 |
| (3-C) 2nd time | 10 | 15 | 0.8 | 2.9 | 53 |
| (3-C) 3rd time | 10 | 15 | 0.4 | 3.2 | 27 |

(The total growth thicknesses from step (3-C), 2nd time and step (3-C), 3rd time are, respectively, the value after 0.2 mm polishing after step (3-C), 1st time and the value after 0.1 mm polishing after step (3-C), 2nd time.)

For Example 3, in the same manner as the first step of Example 1, the growth surface after step (3-C), 1st time was mirror polished to obtain a 2.1 mm grown crystal, and the growth surface after step (3-C), 2nd time was mirror polished to obtain a 2.8 mm grown crystal.

The center section of the growth surface of the grown crystal obtained in the first step was flat and a SiC single crystal was obtained, with no visible threading dislocations.

In the same manner as the second step of Example 1, the seed crystal section was cut out from the obtained grown crystal and removed, the (000-1) plane of the obtained grown crystal was cut out, and the (000-1) plane was mirror polished to obtain a cuboid SiC single crystal having a length of 3.0 mm, a width of 8.0 mm and a thickness of 1.0 mm.

Crystal growth of the (000-1) plane was conducted in the same manner as Example 1-third step, and the grown SiC crystal was cut out from the Si—C solution and graphite shaft and was collected. The obtained grown crystal was a single crystal, the growth occurring with widening diameter with respect to the bottom face of the seed crystal, having a diameter of 5 mm and a thickness of 2.7 mm (excluding the thickness of the seed crystal). The growth rate was 225 μm/h.

Next, in the same manner as Example 1, a plane inclined at 4° from the (0001) plane in the <1-100> direction was cut out, and subjected to mirror polishing, etching and observation of threading screw dislocations, threading edge dislocations, micropipe defects, base plane dislocations and stacking faults. No threading screw dislocations, threading edge dislocations, micropipes, base plane dislocations or stacking faults were detected in the etching surface of the grown crystal obtained in this example, and therefore no defects were present. Moreover, no inclusions were present in the crystal grown in this example.

The nitrogen density in the grown crystal was measured by secondary ion mass spectrometry (SIMS, product of Cameca). The reference sample used was a sample comprising N ion-implanted into a SiC substrate. The nitrogen density of the grown crystal was $2 \times 10^{19}/cm^3$.

Example 4

There was conducted (1-100) plane growth under the same conditions as the first step of Example 1, except that in the first step of this example, step (A) was followed by step (C) repeated 3 times and m-face growth repeated 4 times, without carrying out step (B), and the grown crystal was collected. However, because step (B) was not carried out, the polycrystalline sections on the side faces spread out up to the growth surface, and therefore the polycrystalline sections on the growth surface were removed by 0.7 mm polishing after step (4-C), 1st time and 0.3 mm polishing after step (4-C), 2nd time.

The obtained grown crystal was a single crystal, the growth occurring with widening diameter with respect to the bottom face of the seed crystal substrate, having a diameter of 12 mm and a thickness of 3.1 mm (excluding the thickness of the seed crystal substrate). Polycrystals were distributed in the outer peripheral sections of the grown crystal (growth side sections) and the growth surface, and the polycrystalline sections were removed by polishing.

Table 6 shows the growth conditions for the first step in Example 4 and the thickness of the obtained grown crystal.

TABLE 6

| Step | Temperature gradient (° C./cm) | Growth time (h) | Growth thickness (mm) | Total growth thickness (mm) | Growth rate (μm/h) |
|---|---|---|---|---|---|
| (4-A) | 7 | 15 | 1.3 | 1.3 | 86 |
| (4-C) 1st time | 15 | 24 | 1.4 | 2.7 | 60 |
| (4-C) 2nd time | 15 | 15 | 1.0 | 3.0 | 67 |
| (4-C) 3rd time | 21 | 15 | 1.2 | 3.9 | 80 |

(The total growth thicknesses from step (4-C), 2nd time and step (4-C), 3rd time are, respectively, the value after 0.7 mm polishing after step (4-C), 1st time and the value after 0.3 mm polishing after step (4-C), 2nd time.)

In the same manner as the second step of Example 1, the seed crystal section was cut out from the obtained grown crystal and removed, the (000-1) plane of the obtained grown crystal was cut out, and the (000-1) plane was mirror polished to obtain a cuboid SiC single crystal having a length of 3.0 mm, a width of 5.0 mm and a thickness of 1.0 mm.

Crystal growth of the (000-1) plane was conducted in the same manner as Example 1-third step, and the grown SiC crystal was cut out from the Si—C solution and graphite shaft and was collected. The obtained grown crystal was a single crystal, the growth occurring with widening diameter with respect to the bottom face of the seed crystal, having a diameter of 4 mm and a thickness of 2.5 mm (excluding the thickness of the seed crystal).

Next, a plane inclined at 4° from the (0001) plane in the <1-100> direction was cut out, and subjected to mirror polishing, etching and observation of threading screw dislocations, threading edge dislocations, micropipe defects, base plane dislocations and stacking faults. No threading screw dislocations, threading edge dislocations, micropipes, base plane dislocations or stacking faults were detected in the etching surface of the grown crystal obtained in this example, and therefore no defects were present. Moreover, no inclusions were present in the crystal grown in this example.

The nitrogen density in the grown crystal was measured by secondary ion mass spectrometry (SIMS, product of Cameca). The reference sample used was a sample comprising N ion-implanted into a SiC substrate. The nitrogen density of the grown crystal was $2 \times 10^{19}/cm^3$.

Example 5

A crystal was grown and recovered under the same conditions as step (1-A) of the first step of Example 1, except that the temperature on the surface of the Si—C solution during growth of the crystal was 2030° C. and the temperature gradient was 9.0° C./cm.

TABLE 7

| | Growth surface | Growth time (h) | Growth temperature (° C.) | Temperature gradient (° C./cm) | Growth rate (μm/h) | Growth rate/ temperature gradient ($10^{-4}$ cm$^2$/(h · ° C.) |
|---|---|---|---|---|---|---|
| Example 1 | (1-100) | 15 | 2000 | 7.0 | 93 | 13.3 |
| Example 2 | (1-100) | 15 | 2000 | 15.0 | 144 | 9.6 |
| Example 5 | (1-100) | 15 | 2030 | 9.0 | 100 | 11.1 |
| Example 6 | (1-100) | 15 | 1920 | 9.3 | 80 | 8.6 |
| Example 7 | (1-100) | 15 | 1890 | 10.3 | 83 | 8.1 |
| Example 8 | (1-100) | 10 | 2000 | 8.6 | 172 | 20.0 |

The obtained grown crystal was a single crystal and the growth surface was flat, but inclusions were observed in portions thereof. The growth rate was 100 μm/h.

Example 6

A crystal was grown and recovered under the same conditions as step (1-A) of the first step of Example 1, except that the temperature on the surface of the Si—C solution during growth of the crystal was 1920° C. and the temperature gradient was 9.3° C./cm.

The obtained grown crystal was a single crystal, the growth surface was flat, and no inclusions were observed. The growth rate was 80 μm/h.

Example 7

A crystal was grown and recovered under the same conditions as step (1-A) of the first step of Example 1, except that the temperature on the surface of the Si—C solution during growth of the crystal was 1890° C. and the temperature gradient was 10.3° C./cm.

FIG. 8 shows a photograph of the grown crystal observed from the growth surface. The obtained crystal was a single crystal and no inclusions were observed, but the growth surface was rough as seen in FIG. 8, and a flat surface could not be obtained. The growth rate of the obtained crystal was 83 μm/h.

Example 8

A crystal was grown and collected under the same conditions as step (1-A) of the first step of Example 1, except that a seed crystal substrate with a thickness of 0.5 mm was used, the temperature gradient was 8.6° C./cm, and the growth holding time was 10 hours.

Although the obtained crystal was a single crystal, inclusions were observed, the growth surface was rough similar to Comparative Example 2, and a flat surface could not be obtained. The growth rate of the obtained crystal was 172 μm/h.

Figure 15:
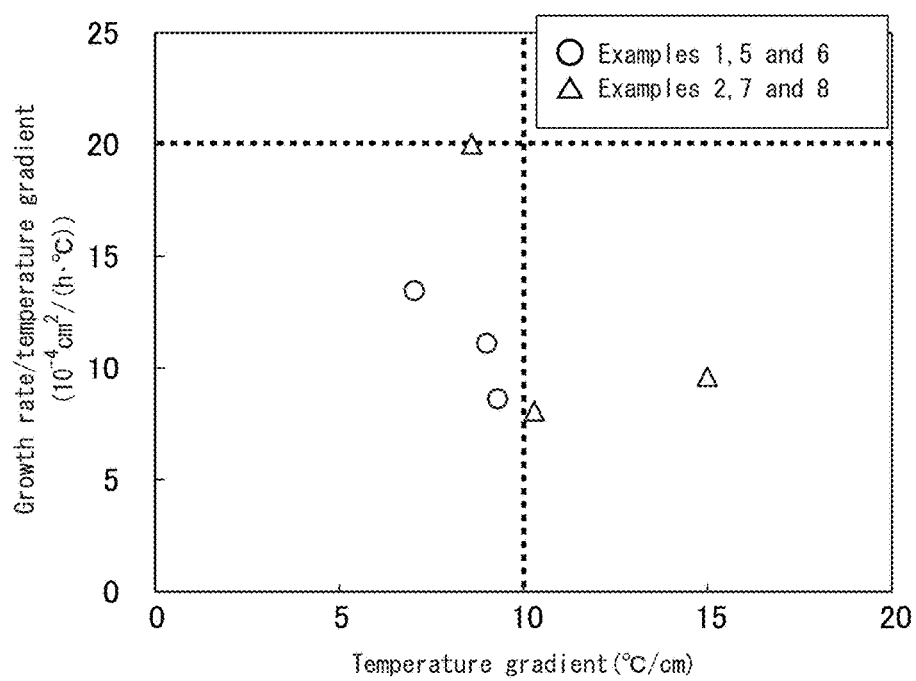
FIG. 15 is a graph showing the optimal growth condition ranges for the temperature gradient in the surface region of the Si—C solution, and the single crystal growth rate/temperature gradient ratio, for (1-100) plane growth.

Table 7 shows the growth surface, surface temperatures of Si—C solution, temperature gradients in the surface region of the Si—C solution, types of crystals obtained, crystal growth rates and growth rate/temperature gradient ratios, for Example 1-first step-step (1-A), Example 2-first step-step (2-A) and Examples 5 to 8. FIG. 15 shows optimal growth condition ranges for the temperature gradients in the surface region of the Si—C solution, and the single crystal growth rate/temperature gradient ratios, for (1-100) plane growth in Example 1-first step-step (1-A), Example 2-first step-step (2-A) and Examples 5 to 8.

By conducting crystal growth under conditions wherein the temperature gradient in the surface region of the Si—C solution was no greater than 10° C./cm and the ratio of the crystal growth rate with respect to the temperature gradient (growth rate/temperature gradient) was less than $20 \times 10^{-4}$ (cm$^2$/(h·° C.)), it was possible to obtain a SiC single crystal having a flat growth surface.

In Examples 5 and 6, similar to Example 1, step (1-B) and onward of the first step were carried out for repeated m-face growth, and the second step and third step were then carried out to grow SiC single crystals of the sizes shown in Table 8. In Examples 7 and 8, flat surfaces were not obtained, but similar to Example 2, the roughened parts of the growth surfaces were removed by polishing, and then similar to Example 1, step (1-B) and onward of the first step were carried out for repeated m-face growth, after which the second step and third step were carried out to grow SiC single crystals having the diameters and thicknesses shown in Table 8.

In addition, for the SiC single crystals obtained in each of the examples, a plane inclined at 4° from the (0001) plane in the <1-100> direction was cut out, and subjected to mirror polishing, etching and observation of threading screw dislocations, threading edge dislocations, micropipe defects, base plane dislocations and stacking faults. Similar to Examples 1 and 2, the etching surfaces of the SiC single crystals grown in Examples 5 to 8 had no visible threading screw dislocations, threading edge dislocations, micropipes, base plane dislocations or stacking faults.

(Observation of Presence/Absence of Inclusions)

The presence/absence of inclusions in the SiC single crystals grown in each of the examples was also evaluated. The SiC single crystal used for measurement of the threading dislocation density was observed with a microscope with light irradiated from below, and upon observing the cross-sectional transmission image, the SiC crystal grown in the third step of each example was found to contain no inclusions.

Table 8 shows the diameters and thicknesses, and the presence or absence of threading dislocations, base plane dislocations and stacking faults, for the SiC single crystals grown in Examples 1 to 8.

TABLE 8

Diameters and thicknesses of SiC single crystals grown in Examples 1 to 8

| | Diameter | Growth thickness (excluding seed crystal thickness) | Presence/absence of threading dislocations, base plane dislocations and stacking faults |
|---|---|---|---|
| Example 1 | 11 | 4.0 | Absent |
| Example 2 | 5 | 3.8 | Absent |
| Example 3 | 5 | 2.7 | Absent |
| Example 4 | 4 | 2.5 | Absent |
| Example 5 | 4 | 3.0 | Absent |
| Example 6 | 3 | 3.6 | Absent |
| Example 7 | 3 | 3.3 | Absent |
| Example 8 | 3 | 3.1 | Absent |

Comparative Example 1

In this example, the first step alone was carried out under the same conditions as the first step in Example 1, without carrying out the second step and third step. The crystal grown by (1-100) plane growth was collected in the same manner as Example 1.

The obtained grown crystal was a single crystal, the growth occurring with widening diameter with respect to the bottom face of the seed crystal substrate, having a diameter of 11 mm and a thickness of 5.1 mm (excluding the thickness of the seed crystal substrate).

Next, a plane inclined at 4° from the (0001) plane in the <1-100> direction was cut out, and subjected to mirror polishing, etching and observation of threading screw dislocations, threading edge dislocations, micropipe defects, base plane dislocations and stacking faults.

Figure 14:
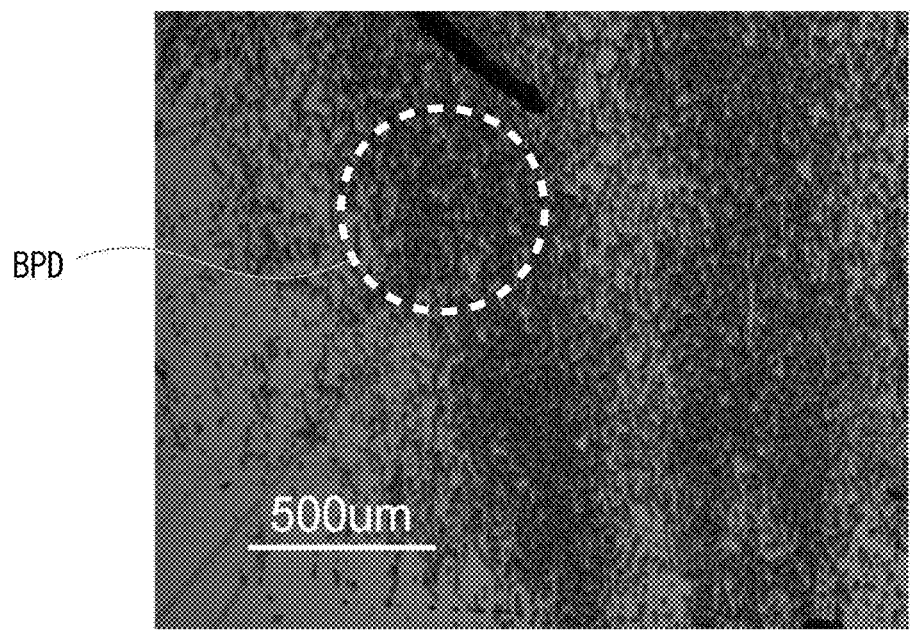
FIG. 14 is a photomicrograph of the etched surface of the SiC crystal grown on the (1-100) plane in Comparative Example 1.

FIG. 14 is a micrograph of the etching surface of the SiC crystal grown in this example. Numerous base plane dislocations were observed in the etching surface.

Comparative Example 2

In this example, there was prepared a SiC single crystal formed by a sublimation process, which was a cuboid 4H-SiC single crystal with a length of 10 mm, a width of 10 mm and a thickness of 1.5 mm, and the (000-1) plane (onset axis plane) as the bottom face, for use as a seed crystal substrate, and the third step alone was carried out under the same conditions as the third step in Example 1, while the first step and second step were not carried out. The crystal grown by (000-1) plane growth was collected in the same manner as Example 1.

The obtained grown crystal was a single crystal, the growth occurring with widening diameter with respect to the bottom face of the seed crystal substrate, having a diameter of 13 mm and a thickness of 3.7 mm (excluding the thickness of the seed crystal substrate).

Next, a plane inclined at 4° from the (0001) plane in the <1-100> direction was cut out, and subjected to mirror polishing, etching and observation of threading screw dislocations, threading edge dislocations, micropipe defects, base plane dislocations and stacking faults. Numerous threading screw dislocations and threading edge dislocations were observed in the etching surface of the grown crystal obtained in this example.

EXPLANATION OF SYMBOLS

1 SiC seed crystal for (1-100) plane growth
2 (1-100) plane-grown crystal
3 SiC crystal for {0001} plane growth
4 Threading dislocation
5 {0001} plane-grown crystal
10 Graphite crucible
12 Graphite shaft
14 Seed crystal substrate
16 Bottom face of seed crystal substrate
18 Heat-insulating material
22 High-frequency coil
22A Upper level high-frequency coil
22B Lower level high-frequency coil
24 Si—C solution
26 Quartz tube
30 SiC grown crystal
32 Widened diameter section
34 Polycrystalline and/or low crystalline single crystal-generated section
36 Removal location
38 Growth surface of grown crystal
40 Width of roughened section
42 Length of roughened section
44 Roughened section
100 Single crystal production apparatus

What is claimed is:

1. A method for producing a SiC single crystal in which a SiC seed crystal substrate is contacted with a Si—C solution having a temperature gradient such that the temperature decreases from the interior toward the surface, to grow a SiC single crystal, the method consisting of:
   a first step in which a SiC single crystal is grown with a (1-100) plane as the growth surface,
   a second step in which a {0001} plane is exposed from the grown SiC single crystal, and
   a third step in which the SiC single crystal having the exposed {0001} plane is used as a seed crystal, and the {0001} plane is used as the growth surface for growth of a SiC single crystal,
   wherein the first, second, and third steps are performed sequentially,
   wherein in the first step, the temperature gradient in the surface region of the Si—C solution is increased at least once during growth of the SiC single crystal, and when the temperature gradient is increased in the first step, the SiC single crystal is continuously grown and the temperature gradient is increased so that an original crystal growth rate is not exceeded.

2. The method according to claim 1, wherein the {0001} plane is a (000-1) plane.

3. The method according to claim 1, wherein the Si—C solution used in the first step and the third step has the same composition.

4. The method according to claim 1, wherein the Si—C solution used in the first step and the third step contains Si and Cr.

5. The method according to claim 1, wherein at least one of the first step and the third step includes:
   (A) a step in which a SiC crystal is grown from a seed crystal,
   (B) a step in which at least part of polycrystalline sections and/or low crystalline single crystal sections is removed from the side faces with respect to the growth direction of the SiC crystal grown in step (A) or step (C), and
   (C) a step in which a SiC crystal is grown from the SiC crystal grown in step (A) or the SiC crystal obtained in step (B), and wherein step (B) and step (C) are carried out one or more times.

6. The method according to claim 1, wherein in the first step, the temperature gradient in the surface region of the Si—C solution is no greater than 10° C./cm, and the ratio of the growth rate of the SiC single crystal with respect to the temperature gradient (single crystal growth rate/temperature gradient) is less than $20 \times 10^{-4}$ cm$^2$/h·° C.

* * * * *